US009148167B2

(12) United States Patent
Aruga et al.

(10) Patent No.: US 9,148,167 B2
(45) Date of Patent: Sep. 29, 2015

(54) CAPACITOR ARRAY, AD CONVERTER AND SEMICONDUCTOR DEVICE

(71) Applicant: FUJITSU SEMICONDUCTOR LIMITED, Yokohama-shi, Kanagawa (JP)

(72) Inventors: Kenta Aruga, Akishima (JP); Fumitoshi Sugimoto, Sagamihara (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/605,434

(22) Filed: Jan. 26, 2015

(65) Prior Publication Data
US 2015/0236711 A1 Aug. 20, 2015

(30) Foreign Application Priority Data
Feb. 19, 2014 (JP) ................. 2014-029768

(51) Int. Cl.
*H03M 1/66* (2006.01)
*H03M 1/46* (2006.01)
*H01L 27/08* (2006.01)

(52) U.S. Cl.
CPC ........... *H03M 1/466* (2013.01); *H01L 27/0805* (2013.01)

(58) Field of Classification Search
CPC ..... H01L 28/40; H01L 27/0805; H01L 27/00; H01L 27/08; H01L 27/04; H01L 23/52; H01L 23/522; H01L 23/532; H01L 23/5223; H01G 4/28; H01G 4/38; H01G 4/012; H03M 1/06; H03M 1/12; H03M 1/144; H03M 1/1215; H03M 1/765; H03M 1/804; H03M 1/468; H03M 1/687; H03M 1/0682; H03M 1/1047; H03M 1/1019; H03M 1/466
USPC .................. 341/145–165; 257/296, E21.008, 257/E27.048
See application file for complete search history.

(56) References Cited

U.S. PATENT DOCUMENTS 6,603,165 B2 * 8/2003 Yamauchi et al. ............. 257/296
6,777,775 B2 * 8/2004 Miyada et al. ................. 257/532
(Continued)

FOREIGN PATENT DOCUMENTS

| JP | 2003-017575 A | 1/2003 |
|---|---|---|
| JP | 2003-152085 A | 5/2003 |
| JP | 2007-081044 A | 3/2007 |

OTHER PUBLICATIONS

Christensen, Kåre, T. "Design and Characterization of Vertical Mesh Capacitors in Standard CMOS", Symposium on VLSI Circuits Digest of Technical Papers, 2001, pp. 201-204.
Aparicio, Roberto, et al., "Capacity Limits and Matching Properties of Integrated Capacitors", IEEE Journal of Solid-State Circuits, Mar. 2002, vol. 37, No. 3, pp. 384-393.
Kuttner, Franz, "A 1.2V 10b 20MSample/s Non-Binary Successive Approximation ADC in 0.13μm CMOS", IEEE International Solid-State Circuits Conference, 2002, (2 pages).
(Continued)

*Primary Examiner* — Lam T Mai
(74) *Attorney, Agent, or Firm* — Westerman, Hattori, Daniels & Adrian, LLP

(57) ABSTRACT

A capacitor array includes a plural capacitors provided separated at intervals from each other. A first wiring line is connected to the first electrode of each of the plurality of capacitors, and is provided so as to pass through the intervals between the plurality of capacitors. A second wiring line is connected to the second electrode of each of the plurality of capacitors, is provided in a layer separated by at least one layer from the layer in which the first wiring line is provided, and is provided so as to pass through the intervals between the plurality of capacitors. A first conductor is provided in a layer between the layer in which the first wiring line is provided and the layer in which the second wiring line is provided, so as to be interposed between the first wiring line and the second wiring line.

20 Claims, 23 Drawing Sheets

(56) References Cited

U.S. PATENT DOCUMENTS

| | | | |
|---|---|---|---|
| 7,928,871 B2* | 4/2011 | Aruga et al. | 341/118 |
| 7,952,509 B2* | 5/2011 | Aruga et al. | 341/163 |
| 2003/0006481 A1 | 1/2003 | Miyada et al. | |
| 2003/0089937 A1 | 5/2003 | Yamauchi et al. | |

OTHER PUBLICATIONS

Abusleme, A., et al., "Mismatch of lateral field metal-oxide-metal capacitors in 180nm CMOS process", Electronics Letters Mar. 1, 2012, vol. 48, No. 5, (2 pages).

* cited by examiner

US 9,148,167 B2

CAPACITOR ARRAY, AD CONVERTER AND SEMICONDUCTOR DEVICE

CROSS-REFERENCE TO RELATED APPLICATION

This application is based upon and claims the benefit of priority of the prior Japanese Patent Application No. 2014-029768, filed on Feb. 19, 2014, the entire contents of which are incorporated herein by reference.

FIELD

The embodiments discussed herein are related to a capacitor array and AD converter.

BACKGROUND

AD converters are devices for outputting a digital code according to a sampled analogue input voltage. There are various architectures for AD converters, and the architecture is selected according to requirements such as conversion speed and resolution determined according to the application.

As a successive approximation-type AD converter, a form of AD converter, a known converter includes a capacitor DA converter and a comparator. The capacitor DA converter includes a capacitor array including plural capacitors with binary-weighted capacitance values. In a successive approximation-type AD converter equipped with a capacitor DA converter, the magnitude relationship between a reference voltage generated by the capacitor DA converter and an analogue input voltage is determined plural times using the comparator, and a digital code is output according to the determination results.

As structures of a capacitor formed in a semiconductor integrated circuit, known structures include a parallel plate structure and a comb structure.

There is, for example, a proposal for a semiconductor device including a capacitor element, a shield body potential-fixed at a specific electrical potential, and plural wiring layers stacked in multiple layers on a semiconductor substrate, with insulation films interposed between each adjacent layer. In such a semiconductor device, the capacitor elements include a first electrode and a second electrode formed in a first wiring layer out of plural wiring layers, on either side of an insulating layer. A shield body includes a first conductor formed so as to surround the capacitor elements in the first wiring layer in plan view, and a second conductor formed so as to, in plan view, surround the capacitor elements in a second wiring layer that is a layer in the plural wiring layers above the first wiring layer.

A semiconductor device is also proposed including a semiconductor substrate, capacitor elements each including a lower electrode formed above the semiconductor substrate, a capacitor insulation film formed above the lower electrode, and an upper electrode formed above the capacitor insulation film, and a shield layer formed above or below the capacitor elements. This semiconductor device includes a lead-out wiring layer, electrically connected to the lower electrode or the upper electrode, and formed between the capacitor elements and the shield layer, with plural holes formed in both the shield layer and the lead-out wiring layer.

There is also a proposal for a semiconductor integrated circuit including plural capacitor cells each including a first electrode and a second electrode, a first wiring line connected to the first electrode and a second wiring line connected to the second electrode, and a shield wiring line provided so as to suppress capacitance coupling between the first wiring line and the second wiring line.

RELATED PATENT DOCUMENTS

Japanese Laid-Open Patent Publication No. 2007-81044.
Japanese Laid-Open Patent Publication No. 2003-152085.
Japanese Laid-Open Patent Publication No. 2003-17575.

SUMMARY

According to an aspect of the embodiments, a capacitor array includes: a plurality of capacitors provided at intervals from each other and each including a first electrode and a second electrode that are provided in at least one layer of a plurality of layers and face each other; a first wiring line connected to the first electrodes of the plurality of capacitors, provided in any layer of the plurality of layers, and provided so as to pass through gaps between the plurality of capacitors or to pass through sites corresponding to the gaps between the plurality of capacitors; a second wiring line connected to the second electrodes of the plurality of capacitors, provided in a layer separated by at least one layer from the layer in which the first wiring line is provided, and provided so as to pass through the gaps between the plurality of capacitors or to pass through sites corresponding to the gaps between the plurality of capacitors; and a first conductor provided in a layer between the layer in which the first wiring line is provided and the layer in which the second wiring line is provided, so as to be interposed between the first wiring line and the second wiring line, and extending across the gaps between the plurality of capacitors, or across sites corresponding to the gaps between the plurality of capacitors, the first conductor being insulated from the plurality of capacitors.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
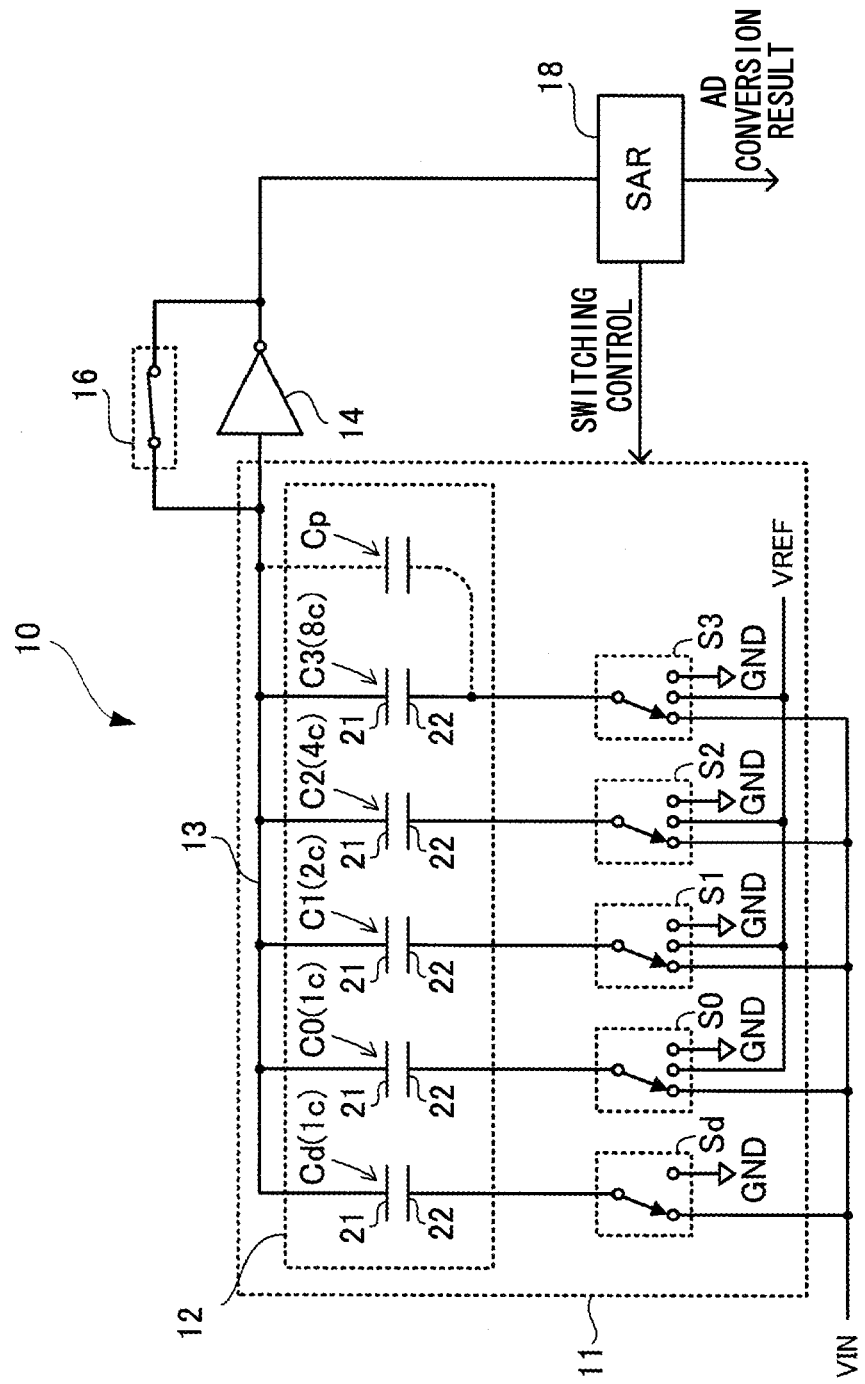
FIG. 1 is circuit diagram illustrating a configuration of an AD converter according to an exemplary embodiment of technology disclosed herein.

Explanation follows regarding an example of an exemplary embodiment of technology disclosed herein, with reference to the drawings. Note that the same reference numerals are appended to configuration elements and parts that are the same as or equivalent to each other in each of the drawings.

First Exemplary Embodiment

FIG. 1 is a circuit diagram illustrating a configuration of an AD converter 10 according to an exemplary embodiment of technology disclosed herein. The AD converter 10 is a successive approximation-type AD converter formed in a semiconductor integrated circuit, and, as an example, has a 4-bit conversion resolution.

The AD converter 10 includes a capacitor array 12 and switches Sd, S0 to S3 that form a capacitor DA converter 11. The AD converter 10 also includes a comparator 14 connected to a common node 13 of the capacitor array 12, a switch 16 provided between the input-output terminals of the comparator 14, and a successive approximation control circuit 18 that is connected to the output terminal of the comparator 14. Note that the AD converter 10 is an example of an AD converter of technology disclosed herein. The capacitor DA converter 11 is an example of a capacitor DA converter of technology disclosed herein. The capacitor array 12 is an example of a capacitor array of technology disclosed herein.

The capacitor array 12 includes capacitors Cd and C0 to C3 that have binary-weighted capacitance values. Namely, the capacitor C0 corresponding to the least significant bit (LSB) has a capacitance value of 1c, the capacitor C1 has a capacitance value of 2c, the capacitor 2C has a capacitance value 4c, and the capacitor C3 corresponding to the most significant bit (MSB) has a capacitance value of 8c. The dummy capacitor Cd has a capacitance value of 1c, the same as the capacitor C0. Although in the present exemplary embodiment four types of capacitor of different capacitance values are included in the capacitor array 12 in order to realize 4-bit conversion resolution, the configuration of capacitors may be changed as appropriate so as to obtain the desired conversion resolution. In cases in which n-bit conversion resolution is desired, n-types of capacitor may be provided wherein the capacitance value of the $k^{th}$ capacitor Ck is $2^{k-1}c$ (wherein k=1, 2, 3, and so on to n).

The capacitors Cd, C0 to C3 each have a top electrode 21 and a bottom electrode 22. The top electrodes 21 of the capacitors Cd, C0 to C3 are each connected to the common node 13, and the common node 13 is connected to the input terminal of the comparator 14. The bottom electrodes 22 of the capacitors Cd, C0 to C3 are each connected to the corresponding switches Sd, S0 to S3.

The switches Sd, S0 to S3 include switching elements such as, for example, metal-oxide-semiconductor (MOS) transistors. The switch Sd switches such that either an analogue input voltage VIN or ground voltage GND is selectively applied to the bottom electrode 22 of the capacitor Cd. The switches S0 to S3 switch such either the analogue input voltage VIN, the ground voltage GND, or a reference voltage VREF is selectively applied to the bottom electrode 22 of the corresponding capacitor C0 to C3. The switches Sd, S0 to S3 switch according to a control signal supplied from the successive approximation control circuit 18.

The AD converter 10 performs AD conversion of the analogue input voltage VIN in the following manner. First, the analogue input voltage VIN is sampled. More specifically, the switches Sd, S0 to S3 are switched such that the analogue input voltage VIN is input to the bottom electrodes 22 of each of the capacitors Cd, C0 to C3. Additionally, the switch 16 provided between the input-output terminals of the comparator 14 is switched to the ON state. Thereby the electrical potential of the bottom electrode 22 side of each of the capacitors Cd, C0 to C3 becomes an electrical potential according to the analogue input voltage VIN, and the electrical potential of the top electrode 21 side (the electrical potential of the common node 13) becomes an electrical potential of about the threshold value voltage of the comparator 14. Namely, charge according to the analogue input voltage VIN is respectively charged in the capacitors Cd, C0 to C3.

The switch 16 is then switched to the OFF state. The common node 13 thereby adopts a floating state, and charge charged in the capacitors Cd, C0 to C3 is not discharged. Then the switch S3 is switched so as to apply the reference voltage VREF to the bottom electrode 22 of the capacitor C3 corresponding to the most significant bit (MSB). The switches Sd, S0 to S2 are also switched so as to apply the ground voltage GND to the bottom electrodes 22 of the capacitors Cd, C0 to C2. The voltage fluctuation amount ΔV of the common node 13 at this time is expressed by following Equation (1).

$$\Delta V = -(VIN - 8c \times VREF/16c) = -(VIN - VREF/2) \quad \text{Equation (1)}$$

In Equation (1), 16c is the total of the capacitance values of the capacitors Cd, C0 to C3, and 8c is the capacitance value of the capacitor C3 applied with the reference voltage VREF.

In Equation (1), since ΔV is a negative value when the analogue input voltage VIN is larger than one half the reference voltage VREF (VIN>VREF/2), the electrical potential of the common node 13 falls, and as a result the comparator 14 outputs a logical value "1". However, since ΔV is a positive value when the analogue input voltage VIN is smaller than one half the reference voltage VREF (VIN<VREF/2), the electrical potential of the common node 13 rises, and as a result the comparator 14 outputs a logical value "0". The output signal of the comparator 14 is held by the successive approximation control circuit 18 as the most significant bit of the AD conversion result.

The reference voltage VREF continues to be applied to the bottom electrode 22 of the capacitor C3 in cases in which a logical value "1" has been output from the comparator 14 in the previous trial. However, the switch S3 is switched such that ground voltage GND is applied to the bottom electrode 22 of the capacitor C3 in cases in which a logical value "0" has been output from the comparator 14 in the previous trial. Then, the switch S2 is switched such that the reference voltage VREF is applied to the bottom electrode 22 of the capacitor C2. The second bit of the AD conversion result is determined based on the output signal of the comparator 14 at this stage. Subsequently, similar trials are performed by sequentially switching the switches S1, S0. The AD conversion result is accordingly determined one bit at a time sequentially from the most significant bit. The successive approximation control circuit 18 outputs the AD conversion result.

Figure 2:
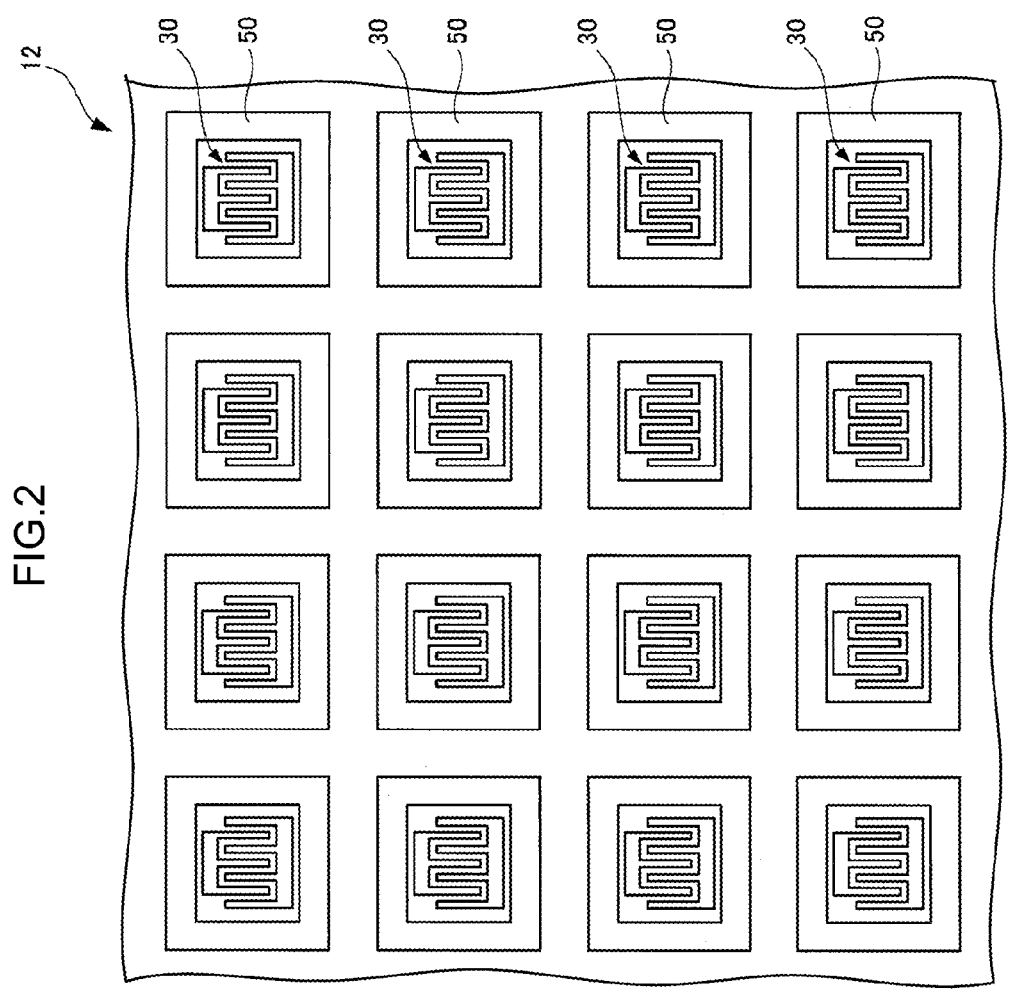
FIG. 2 is a plan view illustrating an arrayed state of plural capacitors configuring a capacitor array according to an exemplary embodiment of technology disclosed herein.

FIG. 2 is a plan view illustrating an example of an arrayed state of plural unit capacitors 30 forming the capacitor array 12 formed on a semiconductor substrate. In the present exemplary embodiment, the capacitor array 12 includes 16 individual unit capacitors 30 each having a capacitance value 1c. The unit capacitors 30 are an example of capacitors of technology disclosed herein. The 16 individual unit capacitors 30 are, as an example, placed side by side so as to form a 4 column×4 row array on the semiconductor substrate. Note that the number of unit capacitors 30 included in the capacitor array 12 may be increased or decreased as appropriate according to the conversion resolution of the AD converter 10. In FIG. 2, top node wiring lines 460 and bottom node wiring lines 450, described later, are omitted from illustration.

The capacitors Cd and C0 having capacitance values 1c illustrated in FIG. 1 are each formed by one of the unit capacitors 30, and the capacitor C1 having a capacitance value 2c is formed by connecting together two of the unit capacitors 30 in parallel. The capacitor C2 having a capacitance value c4 is formed by connecting together four of the unit capacitors 30 in parallel, and the capacitor C3 having a capacitance value 8c is formed by connecting together eight of the unit capacitors 30 in parallel.

Figure 3:
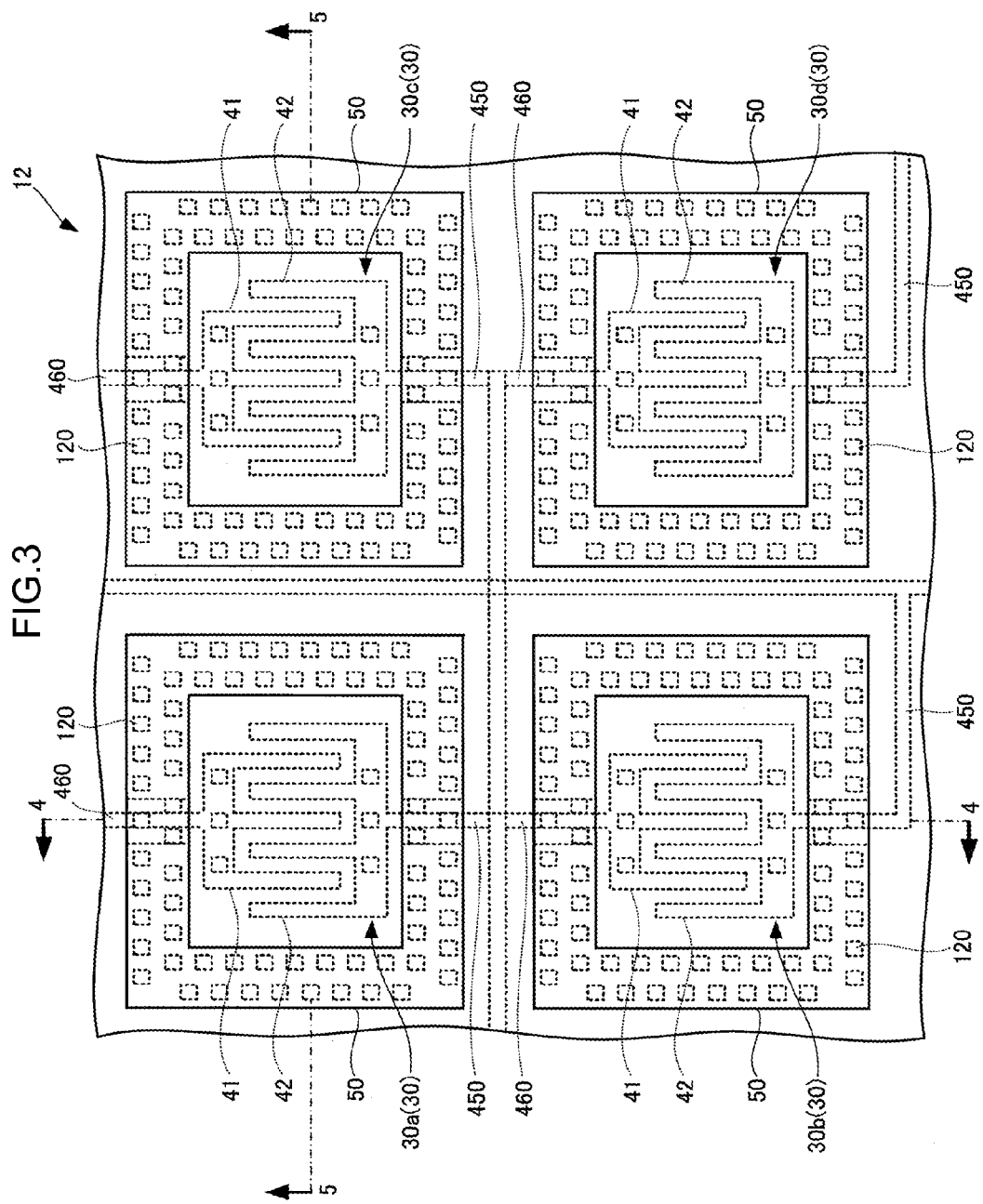
FIG. 3 is a plan view illustrating a configuration of unit capacitors according to an exemplary embodiment of technology disclosed herein.
Figure 4:
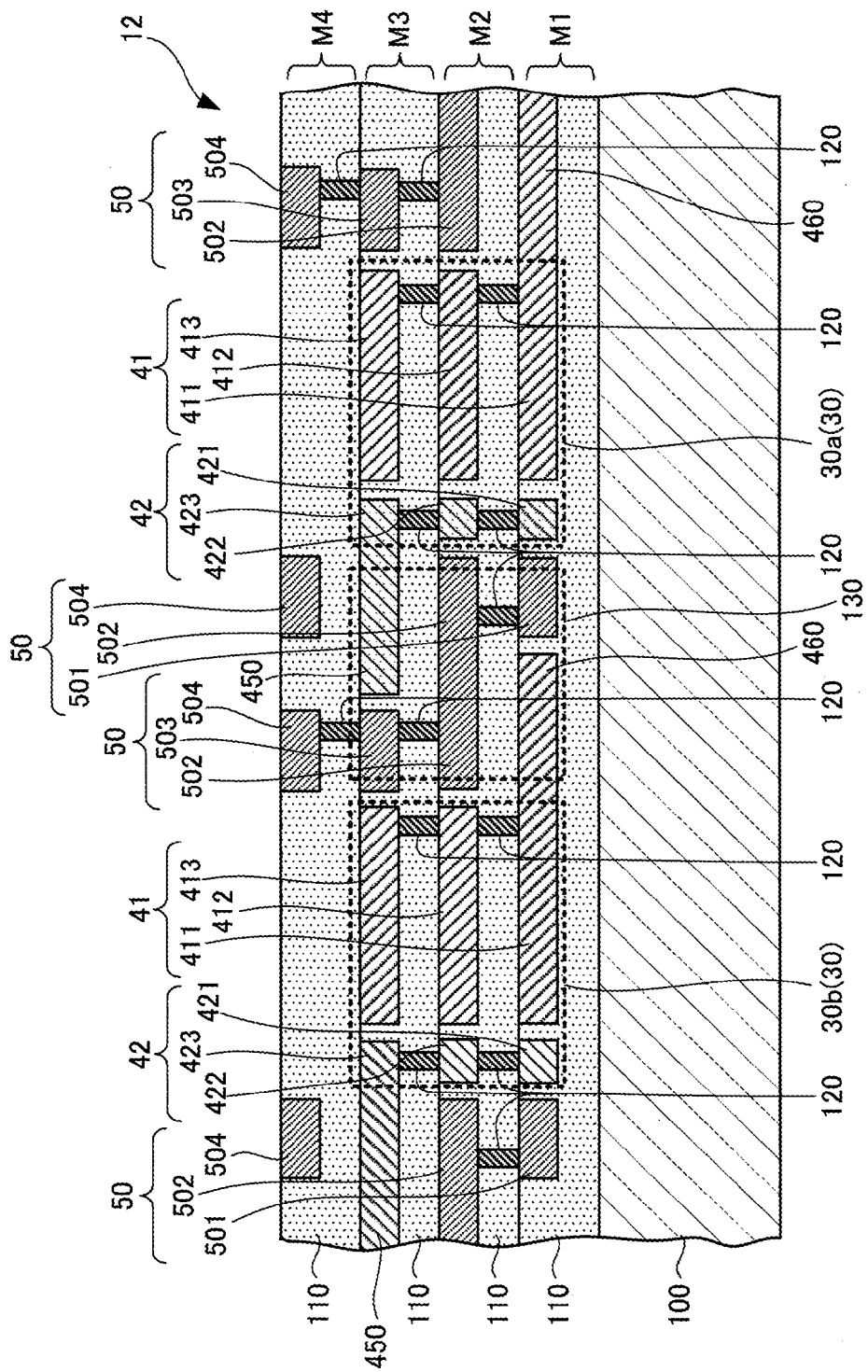
FIG. 4 is a cross-section taken along line 4-4 of FIG. 3.
Figure 5:
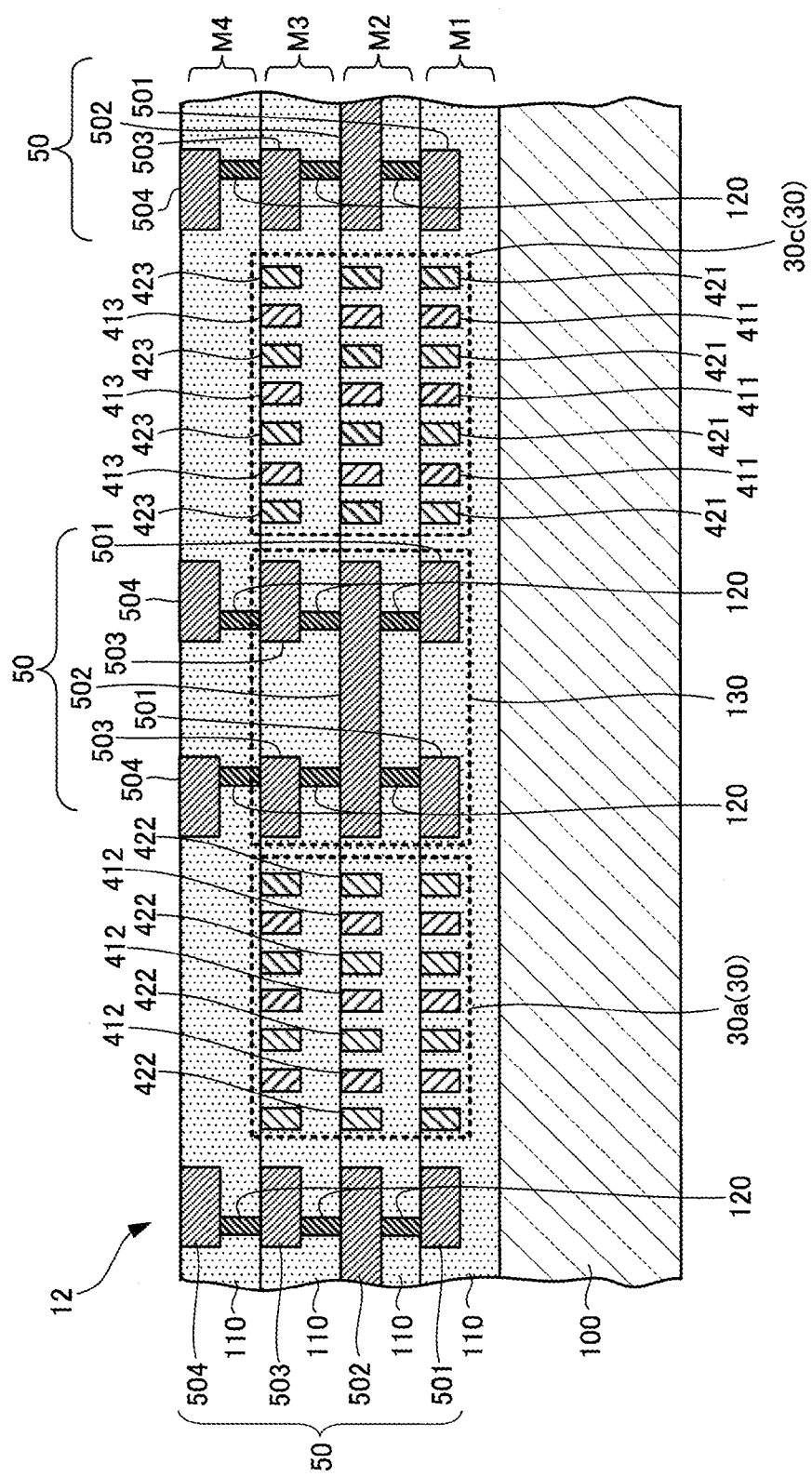
FIG. 5 is a cross-section taken along line 5-5 of FIG. 3.

FIG. 3 is a plan view illustrating a portion of the unit capacitors 30 forming the capacitor array 12, FIG. 4 is a cross-section taken along ling 4-4 of FIG. 3, and FIG. 5 is a cross-section taken along line 5-5 of FIG. 3. FIG. 3 illustrates four unit capacitors 30a, 30b, 30c, and 30d out of the 16 individual unit capacitors 30 included in the capacitor array 12. Note that in the following explanation, reference is made to unit capacitors 30 when not distinguishing between the unit capacitors 30a to 30d.

As illustrated in FIG. 3, each of the unit capacitors 30 includes a first electrode 41 and a second electrode 42 formed by conductors. The first electrodes 41 correspond to the top electrodes 21 of the capacitors Cd, C0 to C3 illustrated in FIG. 1, and the second electrodes 42 correspond to the bottom electrodes 22 thereof. In the present exemplary embodiment, the first electrodes 41 and the second electrodes 42 are formed in comb shapes. The first electrode 41 is an example of a first electrode of technology disclosed herein. The second electrode 42 is an example of a second electrode of technology disclosed herein.

The capacitor array 12 includes a shield section 50. The shield section 50 is formed by a conductor insulated from the unit capacitor 30, and is fixed at a specific electrical potential (for example at ground electrical potential). Details regarding the configuration of the shield section 50 are given below.

As illustrated in FIG. 4 and FIG. 5, each of the unit capacitors 30 is, for example, formed in four layers of metal wiring layers M1 to M4 formed on a semiconductor substrate 100. The metal wiring layers M1 to M4 are an example of plural layers of technology disclosed herein. The number of layers of the metal wiring layers may also be 3 layers, or may be 5 layers or more.

As illustrated in FIG. 4, the first electrode 41 of each of the unit capacitors 30 includes an electrode piece 411 formed in the metal wiring layer M1, an electrode piece 412 formed in the metal wiring layer M2, and an electrode piece 413 formed in the metal wiring layer M3. The electrode pieces 411 to 413 are electrically connected to each other through conductive vias 120. Similarly, the second electrode 42 of each of the unit capacitors 30 includes an electrode piece 421 formed in the metal wiring layer M1, an electrode piece 422 formed in the metal wiring layer M2, and an electrode piece 423 formed in the metal wiring layer M3. The electrode pieces 421 to 423 are electrically connected to each other through conductive vias 120. The electrode pieces 411 to 413, and the electrode pieces 421 to 423 are an example of electrode pieces of technology disclosed herein.

Figure 6:
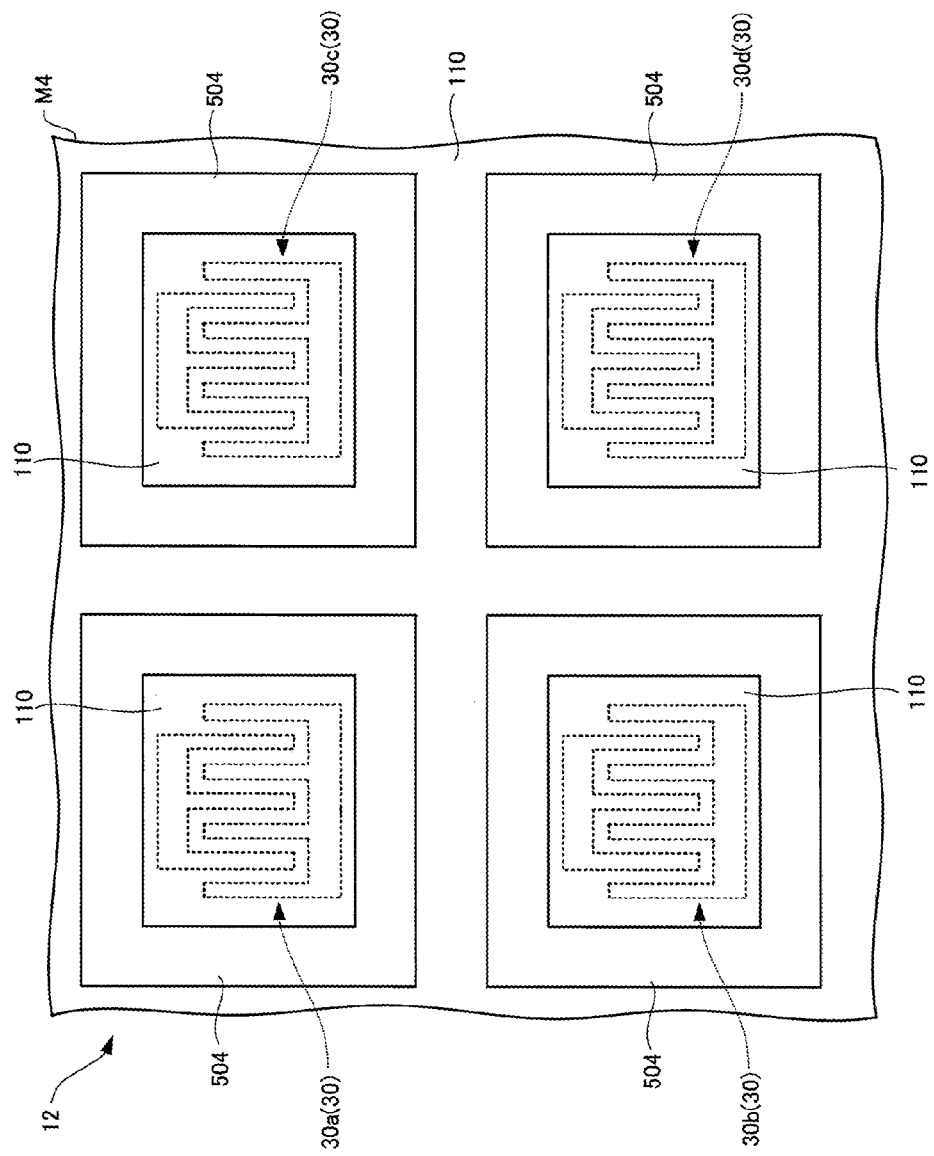
FIG. 6 is a plan view illustrating a layout of a capacitor array in a metal wiring layer M4 according to an exemplary embodiment of technology disclosed herein.
Figure 7:
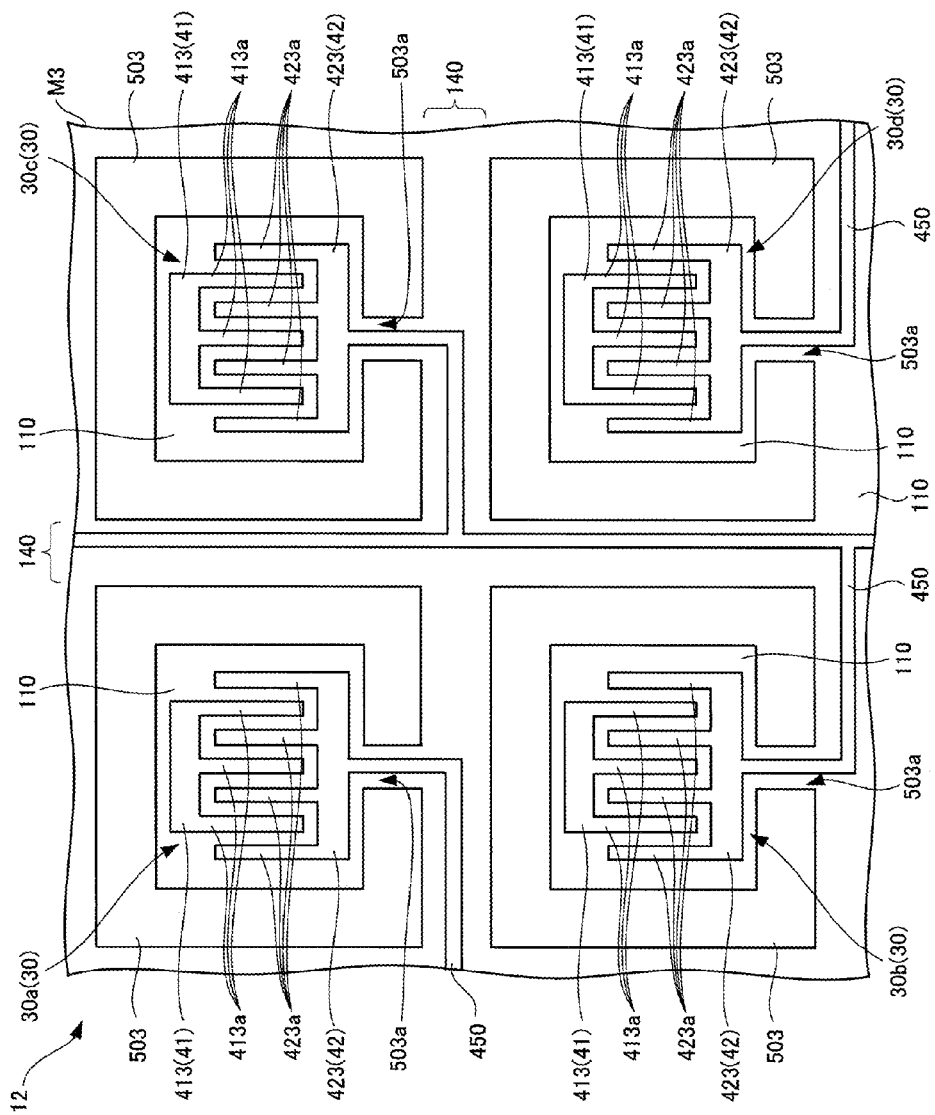
FIG. 7 is a plan view illustrating a layout of a capacitor array in a metal wiring layer M3 according to an exemplary embodiment of technology disclosed herein.
Figure 8:
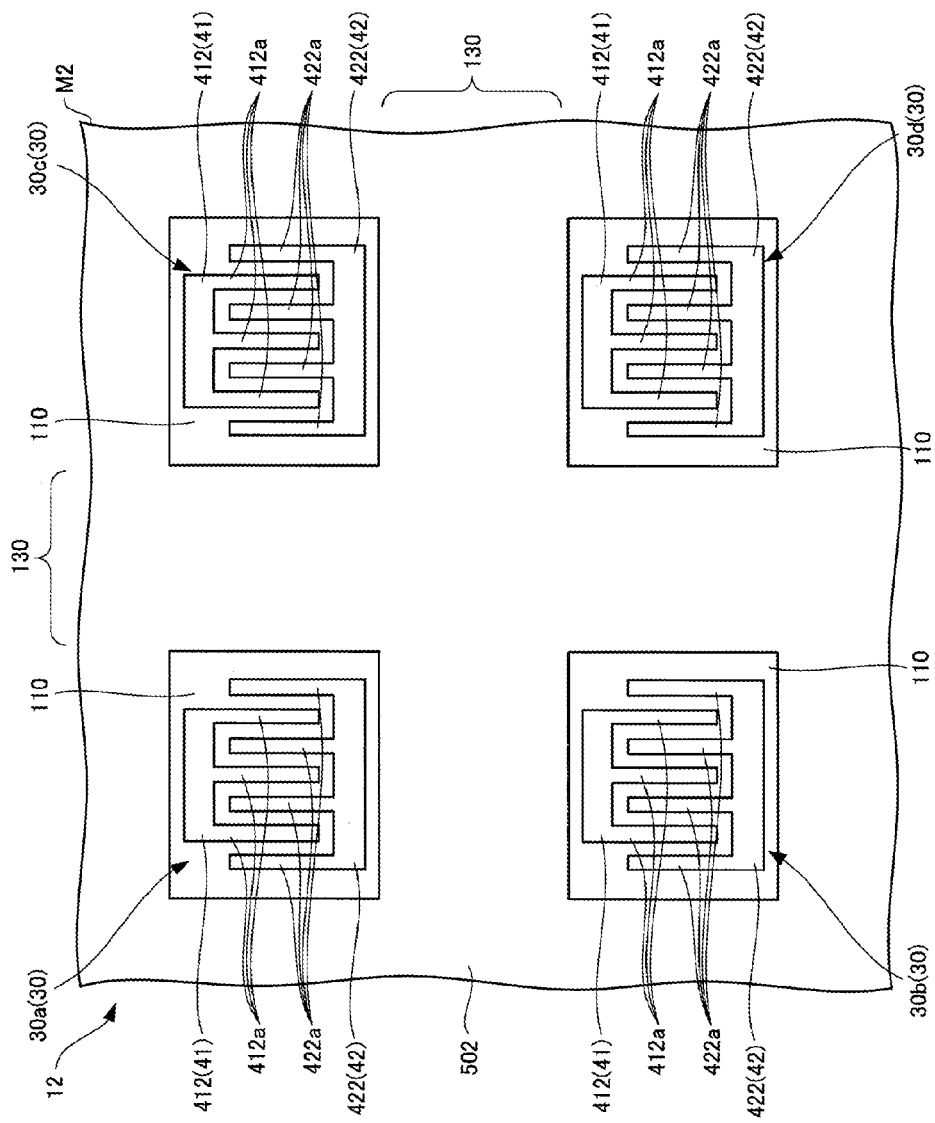
FIG. 8 is a plan view illustrating a layout of a capacitor array in a metal wiring layer M2 according to an exemplary embodiment of technology disclosed herein.
Figure 9:
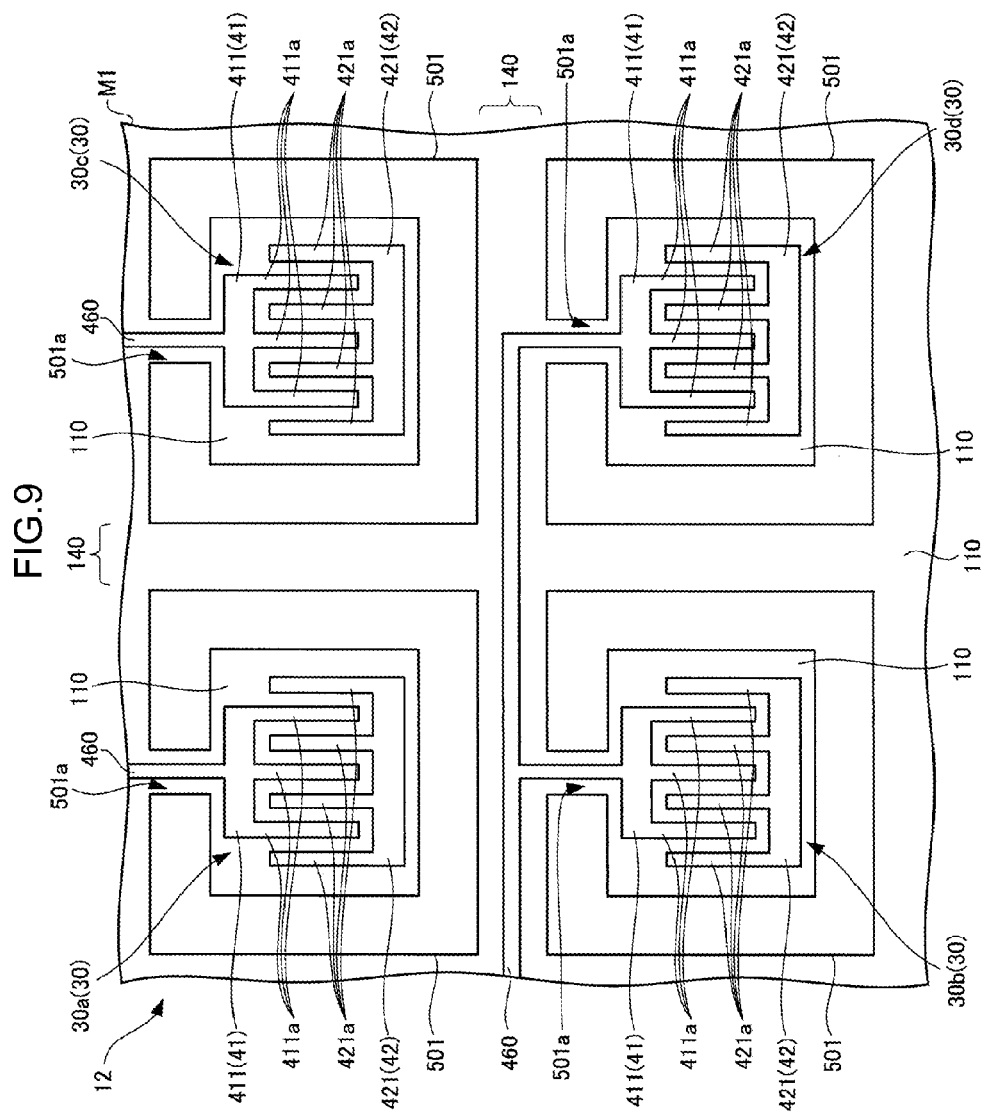
FIG. 9 is a plan view illustrating a layout of a capacitor array in a metal wiring layer M1 according to an exemplary embodiment of technology disclosed herein.

FIG. 6 to FIG. 9 are plan views of each of the metal wiring layers of the capacitor array 12. FIG. 6 illustrates a layout of the capacitor array 12 in the metal wiring layer M4 that is the uppermost layer, and FIG. 7 illustrates a layout of the capacitor array 12 in the metal wiring layer M3 that is one layer below the metal wiring layer M4. FIG. 8 illustrates a layout of the capacitor array 12 in the metal wiring layer M2 that is one layer below the metal wiring layer M3, and FIG. 9 illustrates a layout of the capacitor array 12 in the metal wiring layer M1 that is one layer below the metal wiring layer M2.

As illustrated in FIG. 7, the electrode piece 413 forming each of the first electrodes 41 of the unit capacitors 30 formed in the metal wiring layer M3 includes, as an example, three belt shaped comb tooth portions 413a. The electrode piece 423 forming each of the second electrodes 42 of the unit capacitors 30 formed in the metal wiring layer M3 includes, as an example, four belt shaped comb tooth portions 423a. The three comb tooth portions 413a forming the first electrode 41 are disposed between the comb tooth portions 423a forming the second electrode 42. Namely, the comb tooth portions 413a forming the first electrode 41 and the comb tooth portions 423a forming the second electrode 42 are disposed in a row in the same wiring layer, or in plan view of the semiconductor substrate 100, so as to be placed alternately with the insulating film 110 interposed therebetween. In each of the unit capacitors 30, the electrode piece 423 forming the second electrode 42 is configured so as to surround the electrode piece 413 forming the first electrode 41 on three sides.

As illustrated in FIG. 8, the electrode piece 412 forming the first electrode 41, and the electrode piece 422 forming the second electrode 42, that are formed in the metal wiring layer M2, each have comb shapes similar to those of the electrode pieces 413 and 423 formed in the metal wiring layer M3. Namely, the comb tooth portions 412a forming the first electrode 41 and the comb tooth portions 422a forming the second electrode 42 are disposed in a row in the same wiring layer, or in plan view of the semiconductor substrate 100, so as to be placed alternately with the insulating film 110 interposed therebetween. The electrode piece 422 forming the second electrode 42 is configured so as to surround the electrode piece 412 forming the first electrode 41 on three sides.

As illustrated in FIG. 9, the electrode piece 411 forming the first electrode 41, and the electrode piece 421 forming the second electrode 42, that are formed in the metal wiring layer M1, each have comb shapes similar to those of the electrode pieces 413 and 423 formed in the metal wiring layer M3. Namely, the comb tooth portions 411a forming the first electrode 41 and the comb tooth portions 422a forming the second electrode 42 are disposed in a row in the same wiring layer, or in plan view of the semiconductor substrate 100, so as to be placed alternately with the insulating film 110 interposed therebetween. The electrode piece 421 forming the second electrode 42 is configured so as to surround the electrode piece 411 forming the first electrode 41 on three sides.

Thus in the unit capacitors 30, it is possible to increase the capacitance value per unit surface area by adopting a stacked layer structure, and by adopting a comb shape, for the first electrode 41 and the second electrode 42. In the unit capacitors 30, the number of comb tooth portions and the number of stacked layers of the first electrode 41 and the second electrode 42 may be varied as appropriate to achieve the desired capacitance values. Moreover, the shapes of the electrode pieces formed in the metal wiring layers M1 to M3 may be different from each other.

The shield section 50, as illustrated in FIG. 5, includes shield piece 501 formed in the metal wiring layer M1 and a shield piece 502 formed in the metal wiring layer M2. The shield section 50 also includes shield piece 503 formed in the metal wiring layer M3 and shield piece 504 formed in the metal wiring layer M4. The shield pieces 501 to 504 are electrically connected together through conductive vias 120. The shield piece 502 is an example of a first conductor of technology disclosed herein. The shield piece 501 is an example of a second conductor of technology disclosed herein. The shield piece 503 is an example of a third conductor of technology disclosed herein. The shield piece 504 is an example of a fourth conductor of technology disclosed herein. The vias 120 are an example of connecting conductors of technology disclosed herein.

As illustrated in FIG. 3, plural of the vias 120 connected to the shield section 50 (the shield pieces 501 to 504) are arrayed so as to form two rows along the ring shaped (outer edges of) shield pieces 501, 503 and 504. Each of the vias 120 arrayed in the first row is provided in a position corresponding to a gap between each of the vias 120 arrayed in the second row. Namely, the plural vias 120 are disposed in the shield section 50 such that the rows are staggered with respect to each other.

The shield pieces 504 formed to the metal wiring layer M4 are, as illustrated in FIG. 6, provided corresponding to each of the unit capacitors 30, so as to form a ring shape surrounding the outer periphery of the region corresponding to the forming region of the corresponding unit capacitor 30. The shield pieces 504 have a form that is separated for each of the unit capacitors 30. For example, the shield piece 504 surrounding the outer periphery of the unit capacitor 30a is separated across the insulating film 110 from the shield piece 504 surrounding the outer periphery of the adjacent unit capacitors 30b and 30c.

The shield pieces 503 formed to the metal wiring layer M3 are, as illustrated in FIG. 7, provided corresponding to each of the unit capacitors 30, so as to form a ring shape surrounding the outer periphery of the corresponding unit capacitor 30 (the electrode pieces 413 and 423). Namely, each of the unit capacitors 30 is provided at an inner side of the corresponding shield piece 503. The insulating film 110 is provided between the shield pieces 503 and the respective electrode pieces 413, and between the shield pieces 503 and the electrode pieces 423, and the shield piece 503 is insulated from the electrode pieces 413 and from the electrode pieces 423. The shield pieces 503 have a form that is separated for each of the unit capacitors 30. For example, the shield piece 503 surrounding the outer periphery of the unit capacitor 30a is separated across the insulating film 110 from the shield pieces 503 surrounding the outer periphery of the adjacent unit capacitors 30b and 30c.

The shield pieces 501 formed to the metal wiring layer M3 are, as illustrated in FIG. 9, provided corresponding to each of the unit capacitors 30, so as to form a ring shape surrounding the outer periphery of the corresponding unit capacitor 30 (the electrode pieces 413 and 423). Namely, each of the unit capacitors 30 is provided at an inner side of the corresponding shield piece 501. The insulating film 110 is provided between the shield pieces 501 and the respective electrode pieces 411, and between the shield piece 501 and the electrode pieces 421, and the shield piece 501 is insulated from the electrode pieces 411 and from the electrode pieces 421. The shield pieces 501 have a form that is separated for each of the unit capacitors 30. For example, the shield piece 501 surrounding the outer periphery of the unit capacitor 30a is separated across the insulating film 110 from the shield pieces 501 surrounding the outer periphery of the adjacent unit capacitors 30b and 30c.

The shield piece 502 formed to the metal wiring layer M2 is, as illustrated in FIG. 8, provided so as to completely cover the gaps 130 (peripheral portions of the electrode pieces 412 and 422) between the plural unit capacitors 30. Namely, the shield piece 502 is not separate for each of the unit capacitors 30, and has an integrated form. For example, the shield piece 502 includes plural openings provided at sites in the metal wiring layer M2 corresponding to the plural unit capacitors 30, and is a single conductor insulated from the plural unit capacitors 30, with each of the plural unit capacitors 30 disposed at the inner side of the corresponding opening out of the plural openings. The shield piece 502, for example, includes plural first conductor regions provided so as to surround the outer periphery of the plural unit capacitors 30, and a second conductor region extending across the entire region of the gaps between the plural first conductor regions in the metal wiring layer M2. The insulating film 110 is provided between the shield piece 502 and the electrode pieces 412 and 422, and the shield piece 502 is insulated from the electrode pieces 412 and 422, namely is insulated from the unit capacitors 30. Note that the gaps 130 are an example of gaps between plural capacitors in the technology disclosed herein.

As illustrated in FIG. 7, bottom node wiring lines 450 are connected to the electrode pieces 423 forming the second electrodes 42 formed in the metal wiring layer M3. The bottom node wiring lines 450 are wiring lines for connecting the second electrodes 42 corresponding to the bottom electrode 22 of the capacitors Cd, C0 to C3 illustrated in FIG. 1 to corresponding switches from out of the switches Sd, S0 to S3. Each of the shield pieces 503 surrounding each of the unit capacitors 30 includes an opening 503a formed in the ring shape thereof. The bottom node wiring lines 450 lead out to the outside of the shield pieces 503 from connection points to the electrode pieces 423, through the openings 503a of the shield pieces 503. The bottom node wiring lines 450 lead out to the outside of the shield pieces 503, and lead out to the exterior of the capacitor array 12 through gaps 140 between the respective plural shield pieces 503. The bottom node wiring lines 450 are an example of second wiring lines of technology disclosed herein.

As illustrated in FIG. 9, top node wiring lines 460 are connected to the electrode pieces 411 that form the first electrodes 41 formed in the metal wiring layer M1. The top node wiring lines 460 are wiring lines for connecting the first electrodes 41 corresponding to the top electrodes 21 of the capacitors Cd, C0 to C3 illustrated in FIG. 1 together to form the common node 13. Each of the shield pieces 501 surrounding each of the unit capacitors 30 includes an opening 501a formed in the ring shape thereof. The top node wiring lines 460 lead out to the outside of the shield pieces 501 from connection points to the electrode pieces 411 through the openings 501a of the shield pieces 501. The top node wiring lines 460 leading to the outside of the shield pieces 501 are connected together through gaps 140 of the plural shield pieces 501. Note that the top node wiring lines 460 are an example of first wiring lines of technology disclosed herein.

The bottom node wiring lines 450 are accordingly provided in the metal wiring layer M3, and the top node wiring lines 460 are provided in the metal wiring layer M1. Namely, the bottom node wiring lines 450 and the top node wiring lines 460 are separated from each other in the stacking direction of the metal wiring layers M1 to M4 at an interval equivalent to one layer of metal wiring layer. The bottom node wiring lines 450 and the top node wiring lines 460 are respectively disposed so as to pass through the gaps 140 between the respective shield pieces 503 and 501. However, the shield piece 502 extends across the entire region of the gaps 130 between the respective plural unit capacitors 30 in the metal wiring layer M2 disposed between the metal wiring layer M3 in which the bottom node wiring lines 450 is provided, and the metal wiring layer M1 in which the top node wiring lines 460 is provided. Namely, the shield piece 502 is disposed in the stacking direction of the metal wiring layers M1 to M4 so as to be interposed between the bottom node wiring lines 450 and the top node wiring lines 460. FIG. 4 illustrates the manner in which the shield piece 502 is interposed between the top node wiring lines 460 connected to the unit capacitors 30b and the bottom node wiring lines 450 connected to the unit capacitors 30a at the gaps 130 between the unit capacitors 30.

FIG. 10 to FIG. 13 are diagrams of examples of overall layouts of the capacitor array 12 in the metal wiring layers M4 to M1. FIG. 10 to FIG. 13 illustrate examples of corresponding relationships between each of the unit capacitors 30 forming the capacitor array 12 and the capacitors Cd, C0 to C3 illustrated in FIG. 1.

Figure 10:
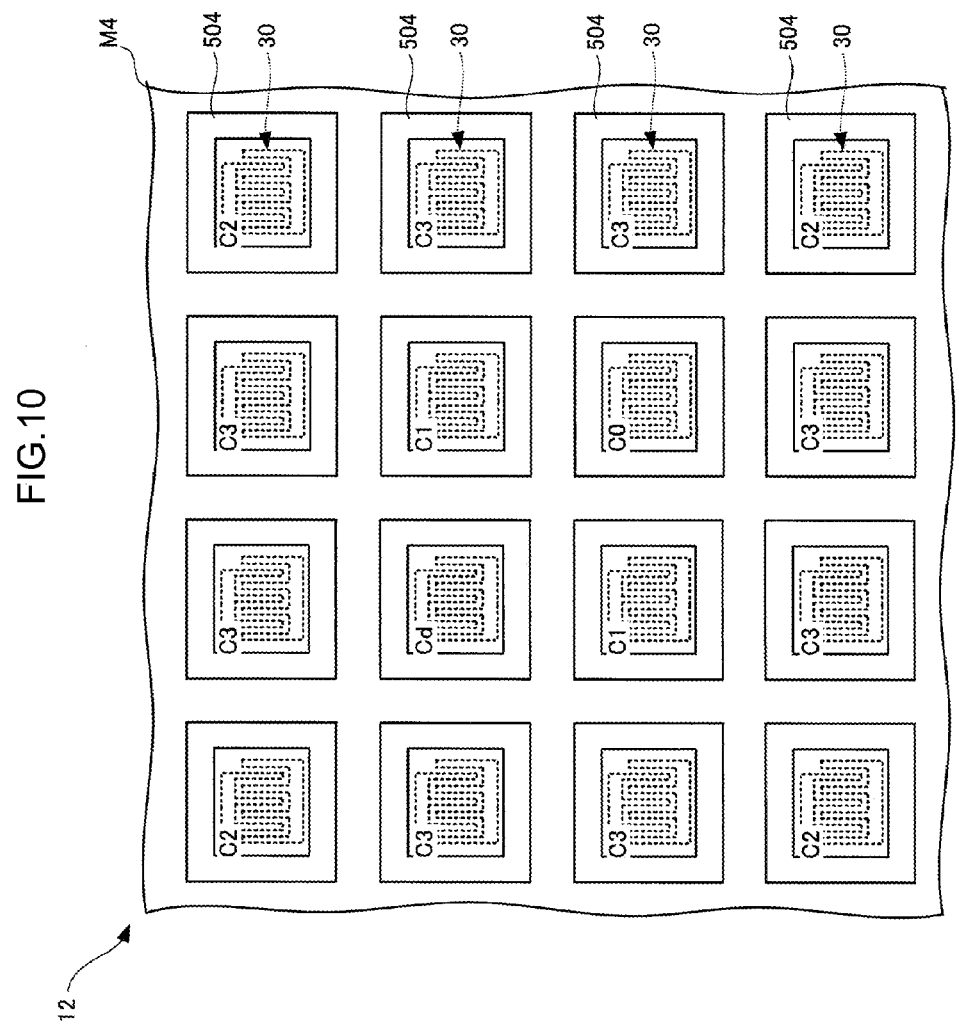
FIG. 10 is a plan view illustrating an overall layout of a capacitor array in a metal wiring layer M4 according to an exemplary embodiment of technology disclosed herein.

As illustrated in FIG. 10, the ring shaped shield pieces 504 surrounding each of the unit capacitors 30 are disposed alongside each other in the metal wiring layer M4 so as to form a 4 column×4 row array.

Figure 11:
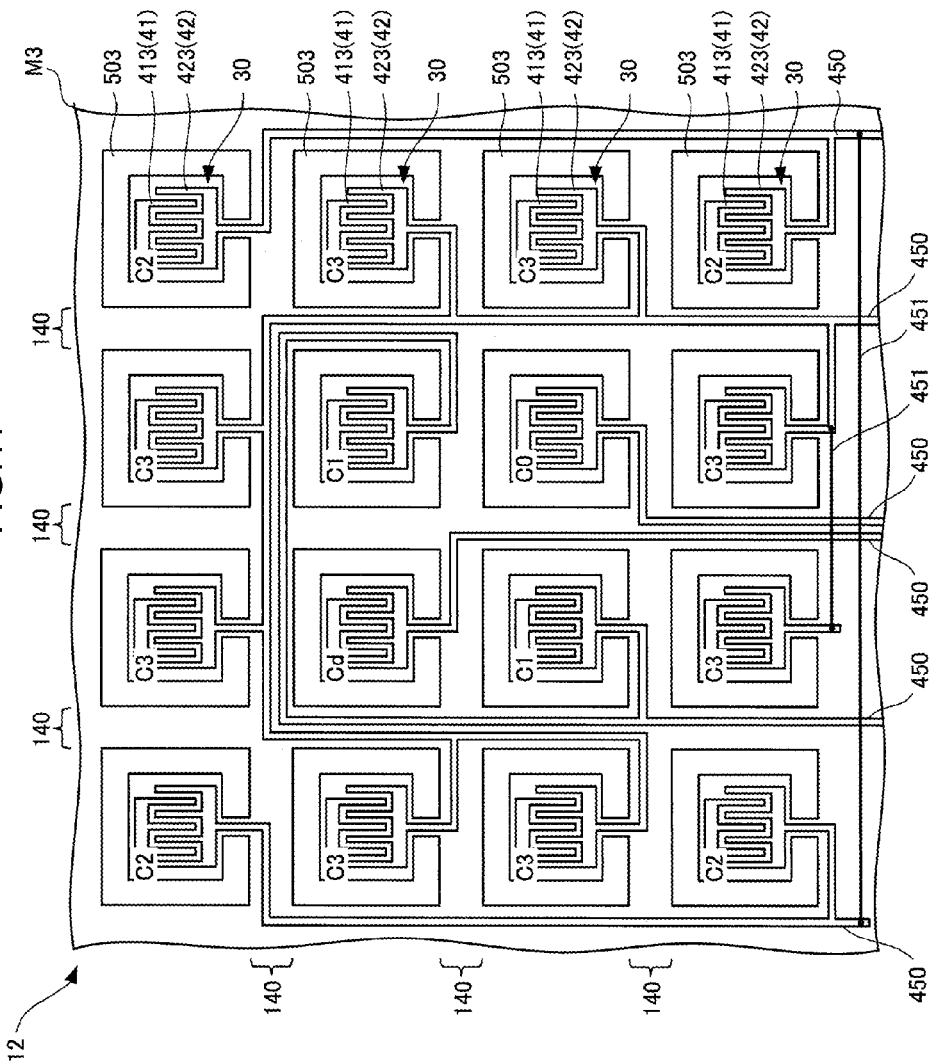
FIG. 11 is a plan view illustrating an overall layout of a capacitor array in a metal wiring layer M3 according to an exemplary embodiment of technology disclosed herein.

As illustrated in FIG. 11, the electrode pieces 413, 423, the shield pieces 503, and the bottom node wiring lines 450 are formed in the metal wiring layer M3.

The capacitor C3 having a capacitance value of 8c is formed by connecting 8 individual unit capacitors 30 each having a capacitance value 1c together in parallel. The respective electrode pieces 423 of the 8 individual unit capacitors 30 forming the capacitors C3 are mutually connected together by the bottom node wiring lines 450 that lead out to the exterior of the capacitor array 12 toward the switch S3 (see FIG. 1).

The capacitor 2C having a capacitance value of 4c is formed by connecting 4 individual unit capacitors 30 having a capacitance value of 1c together in parallel. The respective electrode pieces 423 of the 4 individual unit capacitors 30 forming the capacitor C2 are mutually connected together by the bottom node wiring lines 450 that lead out to the exterior of the capacitor array 12 toward the switch S2 (see FIG. 1).

The capacitor C1 having a capacitance value of 2c is formed by connecting 2 individual unit capacitors 30, having capacitance values of 1c, together in parallel. The respective electrode pieces 423 of the 2 individual unit capacitors 30 forming the capacitor C1 are mutually connected together by the bottom node wiring lines 450 that lead out to the exterior of the capacitor array 12 toward the switch S1 (see FIG. 1).

The capacitors C0 and Cd having a capacitance value of 1c are formed by single unit capacitors 30. The electrode pieces 423 of the unit capacitors 30 forming the capacitor C0 and Cd are respectively led out to the exterior of the capacitor array 12 toward the switches S0 and Sd (see FIG. 1) by the bottom node wiring lines 450.

The bottom node wiring lines 450 are laid out so as to pass through the gaps 140 between the shield pieces 503. In order to implement the desired connection state, a jumper wiring line 451 may be provided if required. The jumper wiring line 451 is wiring that connects each of the bottom node wiring lines 450 together and is formed in a layer other than the metal wiring layer M3. The jumper wiring line 451 is connected to specific bottom node wiring lines 450 through vias. The layout of the bottom node wiring lines 450 is not limited to the layout illustrated in FIG. 11 and may be varied as appropriate.

Figure 12:
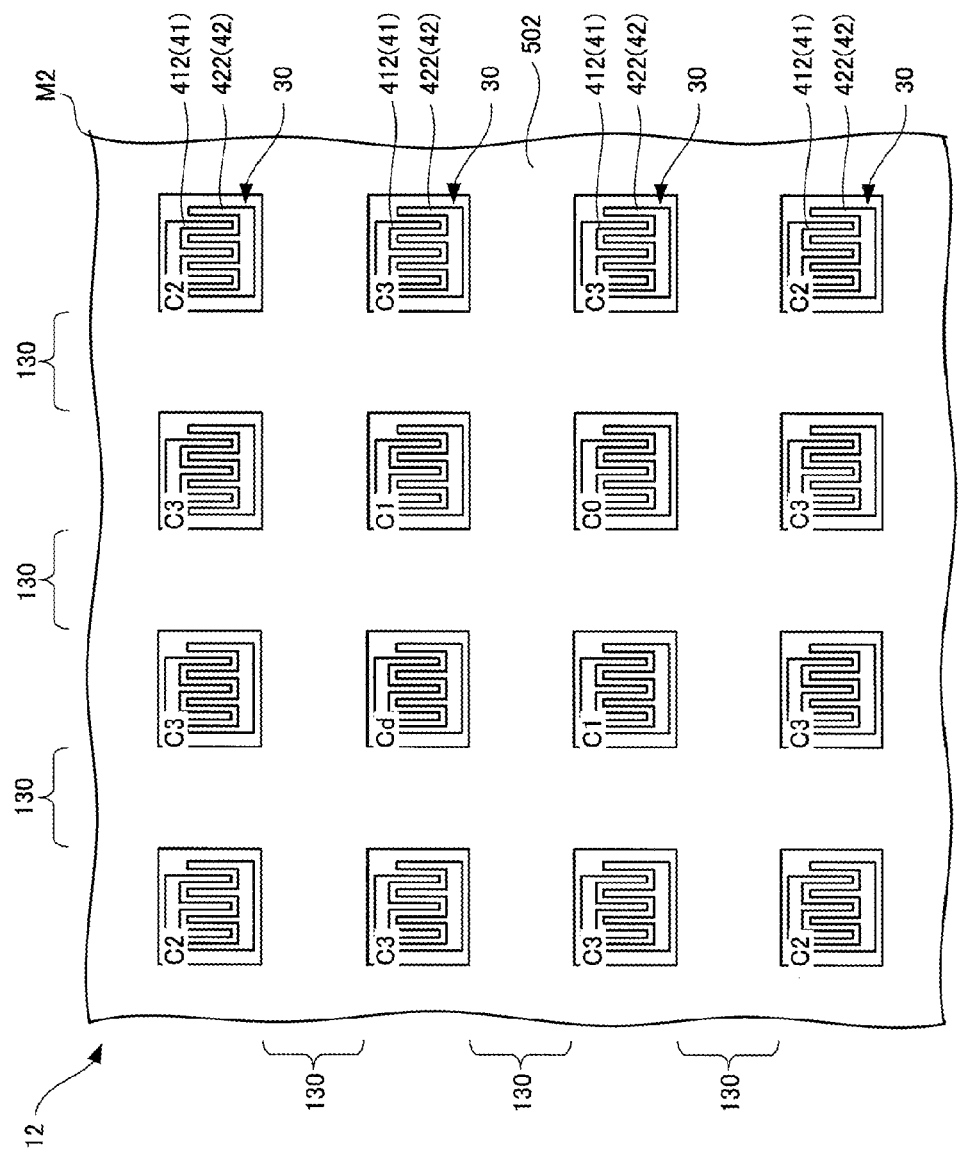
FIG. 12 is a plan view illustrating an overall layout of a capacitor array in a metal wiring layer M2 according to an exemplary embodiment of technology disclosed herein.

As illustrated in FIG. 12, the electrode pieces 412, 422 and the shield piece 502 are provided in the metal wiring layer M2. The shield piece 502 is provided so as to extend across the entire region of the gaps 130 between the plural unit capacitors 30.

Figure 13:
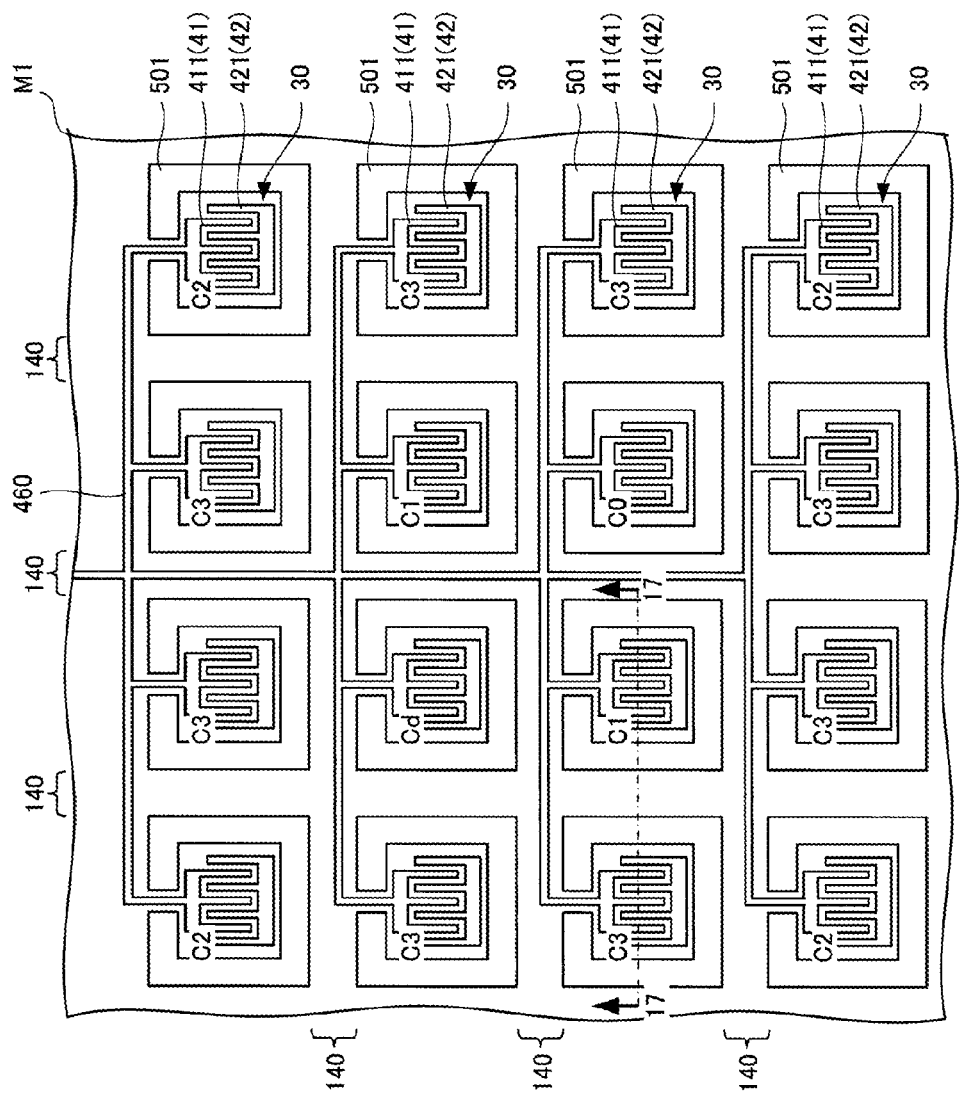
FIG. 13 is a plan view illustrating an overall layout of a capacitor array in a metal wiring layer M1 according to an exemplary embodiment of technology disclosed herein.

As illustrated in FIG. 13, the electrode pieces 411, 421, shield pieces 501 and top node wiring lines 460 are provided in the metal wiring layer M1. The respective electrode pieces 411 of the unit capacitors 30 are connected together by the top node wiring lines 460 leading to the exterior of the capacitor array 12. The top node wiring lines 460 are laid out so as to pass through the gaps 140 between the shield piece 501. The layout of the top node wiring lines 460 is not limited to the layout illustrated in FIG. 13, and may be varied as appropriate.

As is clear from FIG. 11 to FIG. 13, the capacitor array 12 includes the bottom node wiring lines 450 and the top node wiring lines 460 provided at an interval from each other in the stacking direction and on either side of the metal wiring layer M2. The capacitor array 12 includes the shield piece 502 provided in the metal wiring layer M2 extending across the entire region of the gaps 130 between the plural unit capacitors 30, through which the bottom node wiring lines 450 and the top node wiring lines 460 pass. Namely, the capacitor array 12 has a configuration in which the shield piece 502 is interposed between the bottom node wiring lines 450 and the top node wiring lines 460 in the stacking direction of the metal wiring layers M1 to M4.

Explanation follows regarding an example of a manufacturing method of a semiconductor device including the capacitor array 12 according to the present exemplary embodiment. FIG. 14A to FIG. 14E, FIG. 15A to FIG. 15D, and FIG. 16A and FIG. 16B are cross-sections illustrating an example of a manufacturing method of a semiconductor device including the capacitor array 12. The cross-sections illustrated in FIG. 14A to FIG. 16B correspond to the cross-section taken along line 4-4 of FIG. 3.

Figure 14A:
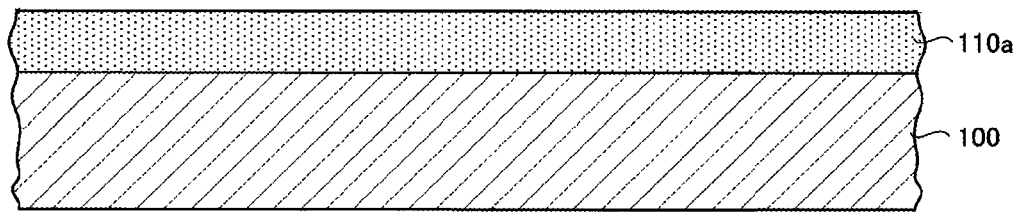
FIG. 14A is a cross-section illustrating a manufacturing method of a capacitor array according to an exemplary embodiment of technology disclosed herein.

First, an insulating film 110a is formed on a semiconductor substrate 100 formed with the comparator 14, the switches 16, Sd, S0 to S3, the successive approximation control circuit 18 and the like (see FIG. 1) of the AD converter 10 (see FIG. 14A). The insulating film 110a may be formed by stacking plural different types of insulator body. The insulating film 110a may, as an example, be formed by sequentially layering a SiC layer, a SiOC layer, and a $SiO_2$ layer. The SiC layer functions to prevent wiring material (for example Cu) from diffusing into the semiconductor substrate 100, and the SiOC layer functions as a Low-k film with comparatively low permittivity. The $SiO_2$ layer functions as a hard mask when etching the insulating film 110a in subsequent processing. The insulating film 110a may, for example, be formed by a known oxidation method, CVD method, coating method, or the like selected as appropriate according to the type of insulator body employed.

Figure 14B:
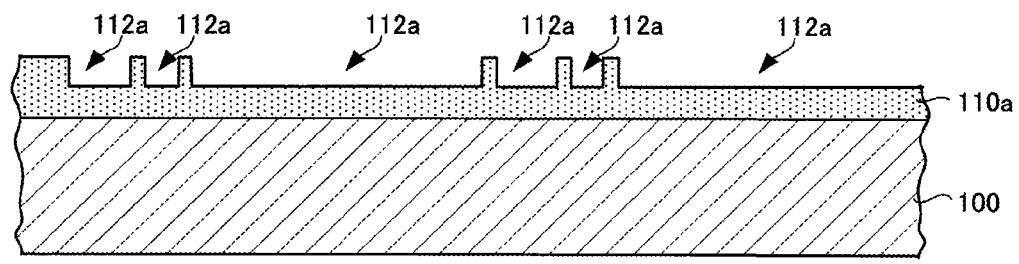
FIG. 14B is a cross-section illustrating a manufacturing method of a capacitor array according to an exemplary embodiment of technology disclosed herein.
Figure 14C:
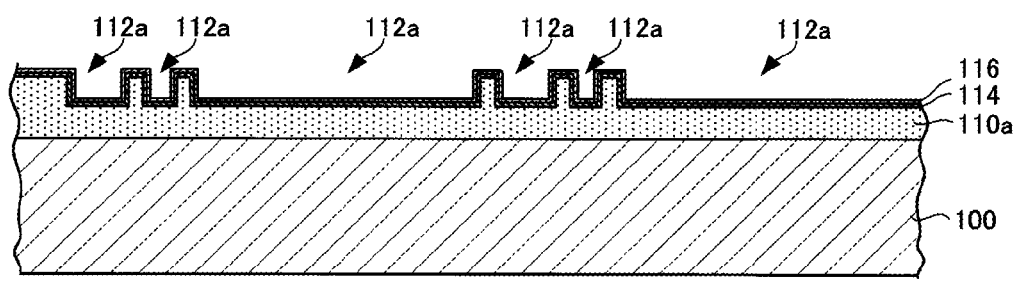
FIG. 14C is a cross-section illustrating a manufacturing method of a capacitor array according to an exemplary embodiment of technology disclosed herein.
Figure 14D:
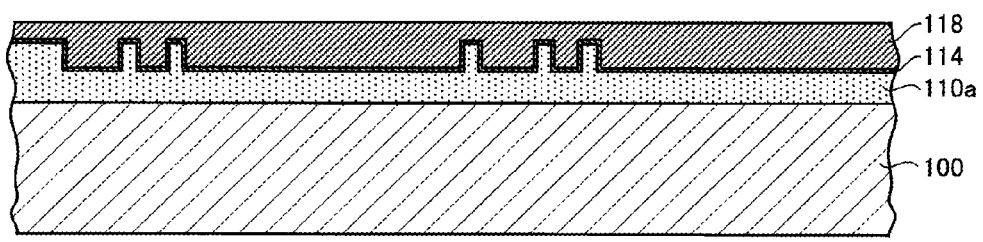
FIG. 14D is a cross-section illustrating a manufacturing method of a capacitor array according to an exemplary embodiment of technology disclosed herein.

Then, for example, known photolithography technology and etching technology is employed to form trenches 112a corresponding to the pattern of the electrode pieces 411, 421, the shield pieces 501, and the top node wiring lines 460 (see FIG. 13) in the insulating film 110a (see FIG. 14B).

Then, for example, a known sputtering technique is employed to form a barrier metal layer 114 on the surface of the insulating film 110a formed with the trenches 112a, in order to prevent diffusion of the wiring material to the inside of the insulating film 110a. TiN may, for example, be employed as the barrier metal layer 114. Then a known sputtering technique is employed to form a seed layer 116 on the surface of the barrier metal layer 114 to function as an electrode when forming wiring material using an electroplating method. Cu, for example, may be employed as the seed layer 116 (see FIG. 14C).

Then wiring material 118 is filled in the trenches 112a by, for example, employing a known electroplating method. Cu, for example, may be employed as the wiring material 118 (see FIG. 14D). Cu has the advantages of having a lower electrical resistance, and a greater tolerance to electromigration than Al.

Figure 14E:
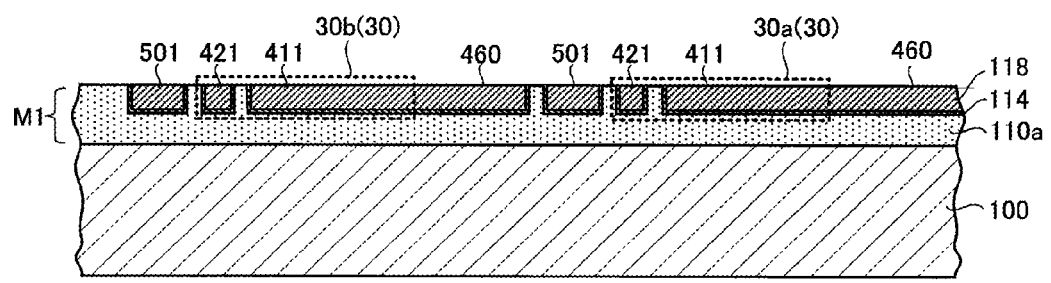
FIG. 14E is a cross-section illustrating a manufacturing method of a capacitor array according to an exemplary embodiment of technology disclosed herein.

Then flattening is performed and extraneous portions of the wiring material 118 are removed by a known chemical mechanical polishing (CMP) method, for example (see FIG. 14E). In the CMP process, the extraneous portions of the wiring material 118 are mechanically removed by employing an abrasive cloth while a slurry containing abrasive particles is employed to chemically react with the extraneous portions of the wiring material 118.

The metal wiring layer M1 is formed through the above processes, and the electrode pieces 411 and 421 of the unit capacitors 30, and the shield pieces 501 and the top node wiring lines 460 of the shield section 50, are formed in the metal wiring layer M1. More specifically, as illustrated in FIG. 13, the comb shaped electrode pieces 411 and 421 for forming the unit capacitors 30, and the ring shaped shield pieces 501 are formed in the metal wiring layer M1 so as to surround the outer periphery of the electrode pieces 411 and 421. The top node wiring lines 460 connected to the electrode pieces 411 and disposed so as to pass through the gaps 140 between the shield pieces 501 are also formed in the metal wiring layer M1.

An insulation film 110b is then formed on the metal wiring layer M1. The insulation film 110b may be formed by a similar method to that of the insulating film 110a of the metal wiring layer M1. Then known photolithography technology and etching technology are employed to form trenches 112b corresponding to the pattern of the vias 120, the electrode pieces 412, 422 and the shield piece 502 (see FIG. 12) in the insulation film 110b (see FIG. 15A).

Then, for example, a known sputtering technique is employed, and the barrier metal layer 114 and the seed layer 116 are formed in sequence on the insulation film 110b formed with the trenches 112b (see FIG. 15).

Then the wiring material 118 is filled in the trenches 112b by employing, for example, a known electroplating method. The wiring material 118 both fills in portions of the trenches 112b corresponding to the vias 120, and fills in portions thereof corresponding to the electrode pieces 412, 422 and the shield piece 502 (see FIG. 15C).

Figure 15A:
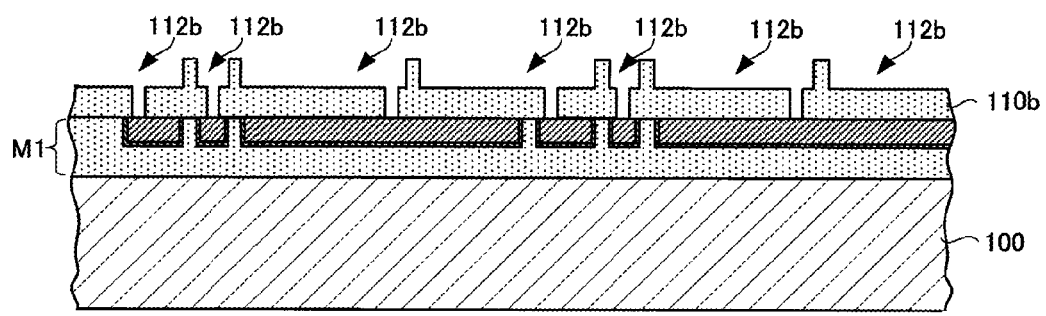
FIG. 15A is a cross-section illustrating a manufacturing method of a capacitor array according to an exemplary embodiment of technology disclosed herein.
Figure 15B:
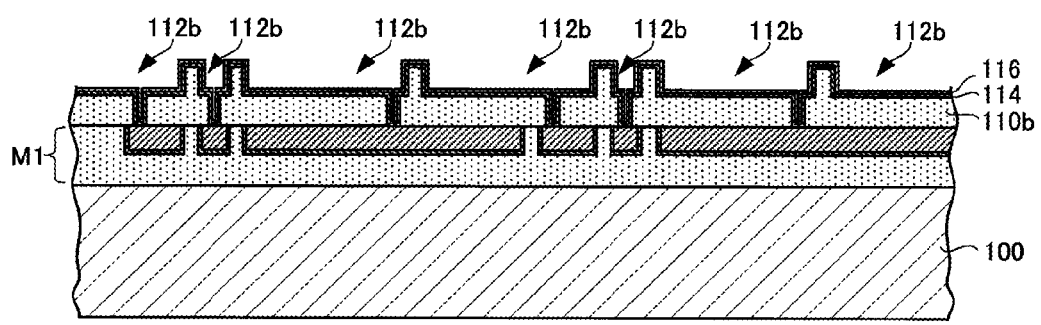
FIG. 15B is a cross-section illustrating a manufacturing method of a capacitor array according to an exemplary embodiment of technology disclosed herein.
Figure 15C:
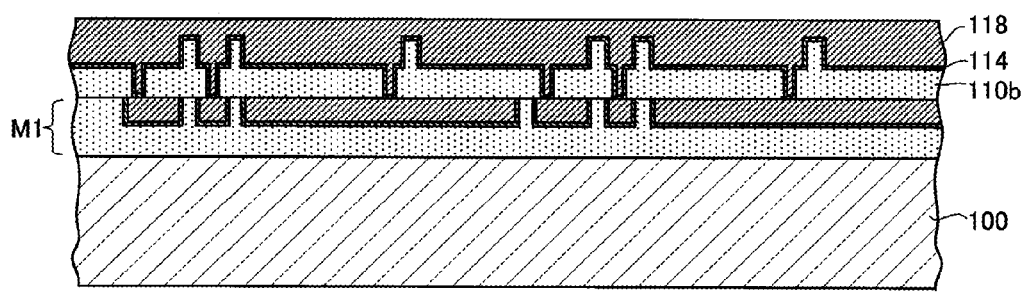
FIG. 15C is a cross-section illustrating a manufacturing method of a capacitor array according to an exemplary embodiment of technology disclosed herein.
Figure 15D:
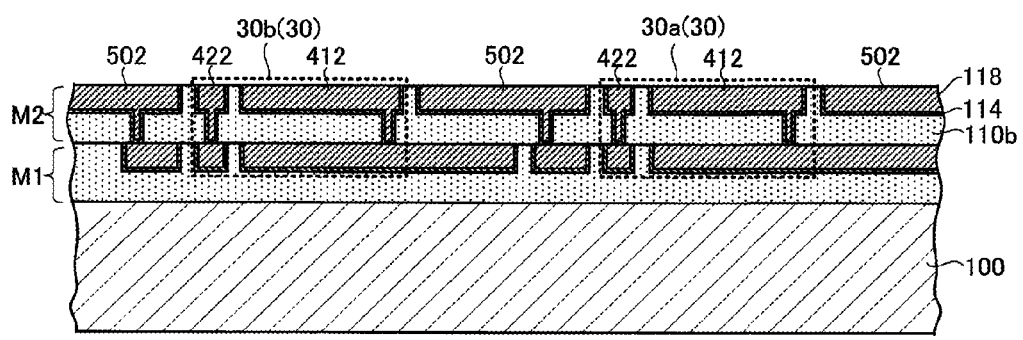
FIG. 15D is a cross-section illustrating a manufacturing method of a capacitor array according to an exemplary embodiment of technology disclosed herein.

Then, flattening is performed, and extraneous portions of the wiring material 118 are removed by a known chemical mechanical polishing (CMP) method, for example (see FIG. 15D).

Through each of the processes described above, the metal wiring layer M2 is formed, and the electrode pieces 412, 422 of the unit capacitors 30 and the shield piece 502 of the shield section 50 are formed in the metal wiring layer M2. More specifically, as illustrated in FIG. 12, the comb shaped electrode pieces 412 and 422 for forming the unit capacitors 30 are formed, and the shield piece 502 is formed so as to extend across the entire region of the gaps 130 between the plural unit capacitors 30, in metal wiring layer M2.

Figure 16A:
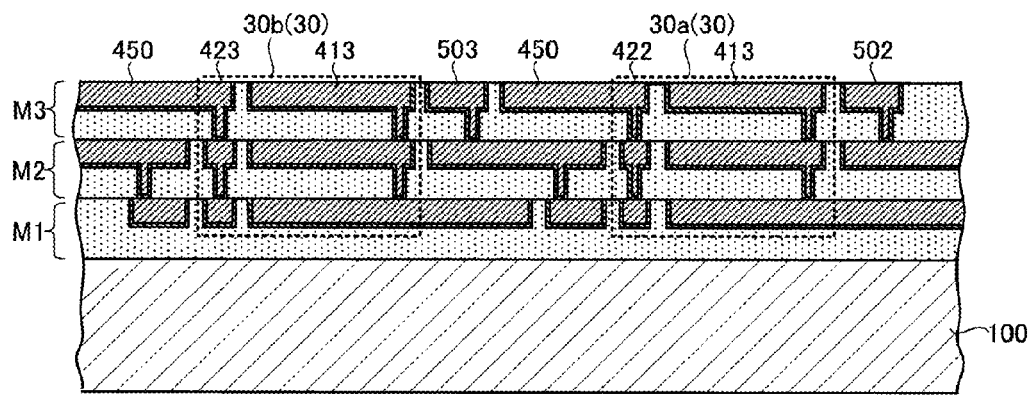
FIG. 16A is a cross-section illustrating a manufacturing method of a capacitor array according to an exemplary embodiment of technology disclosed herein.

The metal wiring layer M3 is then formed on the metal wiring layer M2 (see FIG. 16A). The metal wiring layer M3 may be formed by a similar process to those of the metal wiring layers M1 and M2, and so detailed explanation thereof is omitted. The electrode pieces 413 and 423 of the unit capacitors 30, the shield pieces 503 of the shield section 50, and the bottom node wiring lines 450, are formed in the metal wiring layer M3. More specifically, as illustrated in FIG. 11, the comb shaped electrode pieces 413 and 423 for forming the unit capacitors 30, and the ring shaped shield pieces 503 formed so as to surround the outer periphery of the electrode pieces 413 and 423, are formed in the metal wiring layer M3. The bottom node wiring lines 450 are also formed in the metal wiring layer M3, connected to the electrode pieces 423, and disposed so as to pass through the gaps 140 between the shield pieces 503.

Figure 16B:
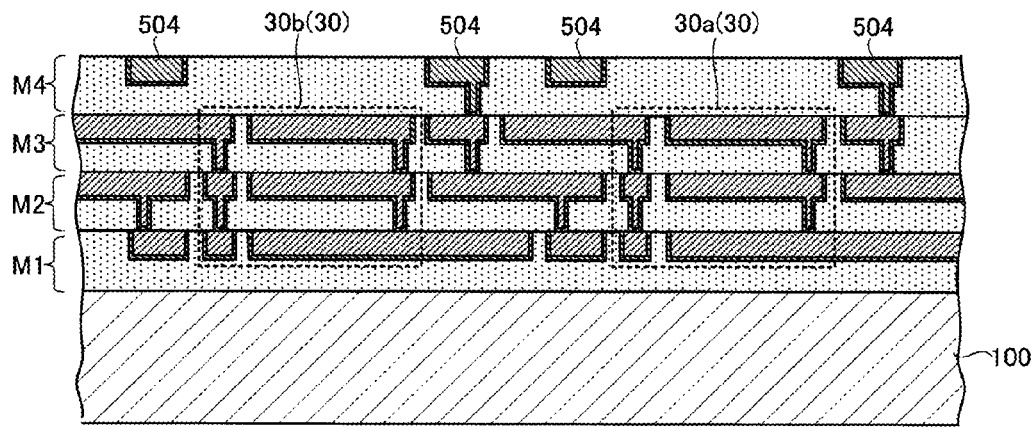
FIG. 16B is a cross-section illustrating a manufacturing method of a capacitor array according to an exemplary embodiment of technology disclosed herein.

The metal wiring layer M4 is formed on the metal wiring layer M3 (see FIG. 16B). The metal wiring layer M4 may be formed by a similar process to those of the metal wiring layers M1 to M3, and so detailed explanation thereof is omitted. The shield pieces 504 are formed in the metal wiring layer M4. More specifically, as illustrated in FIG. 10, the ring shaped shield pieces 504 are formed in the metal wiring layer M4 so as to surround the outer periphery of the forming region each of the unit capacitors 30.

As described above, the semiconductor device including the capacitor array 12 according to the present exemplary embodiment may be manufactured by application of damascene processes.

Explanation follows regarding advantageous effects of the capacitor array 12 and the AD converter 10 according to the present exemplary embodiment.

In the AD converter 10 according to the present exemplary embodiment, in order to obtain high precision AD conversion output, there is preferably high relative precision in the capacitance values of the binary-weighted capacitors Cd, C0 to C3. In the capacitor array 12, an example of a possible cause of deterioration in relative precision of capacitance values of the capacitors Cd, C0 to C3 is a parasitic capacitor connected to the capacitors Cd, C0 to C3. For example, as illustrated in FIG. 1, if a parasitic capacitor Cp is only connected in parallel to the capacitor C3, then the capacitance value of the capacitor C3 becomes larger than 8c, with a deterioration in the relative precision (binary-weightedness) of the capacitance values of the capacitors Cd, C0 to C3. Errors accordingly occur in the digital code output from the AD converter 10, sometimes resulting in appropriate AD conversion results being unobtainable.

In the capacitor array 12 according to the present exemplary embodiment, the bottom node wiring lines 450 and the top node wiring lines 460 are provided at an interval from each other in the stacking direction of the metal wiring layers M1 to M4, with an interval therebetween equivalent to one layer of metal wiring layer. This thereby enables a shield member fixed at a specific electrical potential (for example ground potential) to be inserted between the bottom node wiring lines 450 and the top node wiring lines 460. The capacitor array 12 includes the shield piece 502 fixed to the specific electrical potential in the metal wiring layer M2, between the metal wiring layer M3 in which the bottom node wiring lines 450 are formed and the metal wiring layer M1 in which the top node wiring lines 460 are formed. The shield piece 502 is interposed between the bottom node wiring lines 450 and the top node wiring lines 460 extending over the gaps 130, between the plural unit capacitors 30, where the bottom node wiring lines 450 and the top node wiring lines 460 are disposed. This thereby enables electrostatic coupling between the bottom node wiring lines 450 and the top node wiring lines 460 to be prevented by interposing the shield piece 502, formed from a conductor, between the bottom node wiring lines 450 and the top node wiring lines 460. In the present exemplary embodiment, the shield piece 502 extends across the entire region of the gaps 130 between the plural unit capacitors 30, thereby enabling electrostatic coupling to be prevented whatever the layout of the bottom node wiring lines 450 and the top node wiring lines 460.

Were electrostatic coupling to be formed between the bottom node wiring lines 450 and the top node wiring lines 460, then this would result in a parasitic capacitor being connected in parallel to the unit capacitors 30 connected by these wiring lines. If a circuit were to be connected in parallel to the unit capacitor 30, then this would change the capacitance value of the unit capacitor 30 from the design value, and the relative precision of capacitance values in the plural unit capacitors 30 forming the capacitor array 12 would deteriorate. According to the capacitor array 12 according to the present exemplary embodiment, since the creation of a parasitic capacitor connected in parallel to the unit capacitors 30 is prevented, it is possible to prevent deterioration in the relative precision of the capacitance values of the plural unit capacitors 30. This thereby enables a high precision AD conversion output to be obtained in the AD converter 10.

The capacitor array 12 according to the present exemplary embodiment includes the shield section 50 containing the shield pieces 501, 503, and 504 provided so as to surround the respective outer peripheries of the unit capacitors 30. This thereby enables electrostatic coupling between the wiring lines disposed at the outside of the shield section 50, and the first electrodes 41 disposed at the inner side of the shield section 50, to be prevented from forming. For example, as illustrated in FIG. 3, the bottom node wiring line 450 connected to the unit capacitor 30a is disposed at the outside of the shield section 50 that surrounds the outer periphery of the unit capacitor 30b. This thereby enables electrostatic coupling between the first electrode 41 of the unit capacitor 30b and the bottom node wiring lines 450 connected to the unit capacitor 30a to be prevented from forming. Moreover, surrounding the outer periphery of each of the unit capacitors 30 by the shield section 50 enables electrostatic coupling to be prevented from forming between the mutually adjacent unit capacitors 30.

The vias 120 that electrically connect together the shield pieces 501 to 504 forming the shield section 50 are, as illustrated in FIG. 3, arrayed so as to form 2 rows along the ring shape (outer edge) of the shield section 50. Each of the vias 120 arrayed in the first row is provided at a position corresponding to a gap between vias 120 arrayed in the second row. Disposing the plural vias 120 at mutually different positions on the shield section 50 enables leakage of electrical power lines from gaps between the vias 120 to be prevented, enabling the shielding effect of the shield section 50 to be raised.

Moreover, in the capacitor array 12 according to the present exemplary embodiment, the electrode pieces 411, 412, and 413 forming the first electrodes 41 of the unit capacitors 30, and the electrode pieces 421, 422, and 423 forming the second electrodes 42 of the unit capacitors 30, are formed in the metal wiring layers M1 to M3. In contrast thereto, the shield pieces 501 to 504 forming the shield section 50 are formed in the metal wiring layers M1 to M4. Namely, the number of layers of the shield section 50 is greater than the number of layers of the unit capacitors 30, with the shield pieces 504 provided in the metal wiring layer M4 above the metal wiring layers M1 to M3 in which the unit capacitors 30 are formed. Such a configuration enables reduction of the capacitance value of a parasitic capacitor formed through a region above the metal wiring layer M1 to M3 in which the unit capacitors 30 are formed.

Each of the unit capacitors 30 according to the present exemplary embodiment has a structure in which the electrode pieces 421, 422, and 423 forming the second electrode 42 surround the electrode pieces 411, 412, and 413 forming the first electrode 41 on three sides. The capacitance value of any parasitic capacitor formed between the first electrode 41 and the shield section 50 can thereby be made smaller than cases in which such a structure is not adopted. Any parasitic capacitor formed between the first electrode 41 and the shield section 50 causes attenuation of output signal of the capacitor DA converter 11, and so the capacitance value of such a parasitic capacitor is preferably small. Note that any parasitic capacitor formed between the second electrode 42 and the shield section 50 detrimentally affects neither the relative precision of the capacitance values of the unit capacitors 30, nor the output signal of the capacitor DA converter 11.

Each of the unit capacitors 30 according to the present exemplary embodiment includes electrode pair with a symmetrical structure of the first electrodes 41 and the second electrodes 42. This enables the capacitor array 12 to also have a symmetrical structure due to the symmetrical structure of the electrode pairs of the unit capacitors 30. Giving the capacitor array 12 a symmetrical structure facilitates countermeasures to reduce the effect of manufacturing errors on the relative precision of the capacitance values of the unit capacitors 30 even when linear manufacturing errors occur, such as an inclination in the thickness of the metal layer or an insulating layer of the metal wiring layers M1 to M4. Thus even if such manufacturing errors arise, deterioration in the relative precision of the capacitance values of the unit capacitors 30 can still be easily suppressed.

Figure 17:
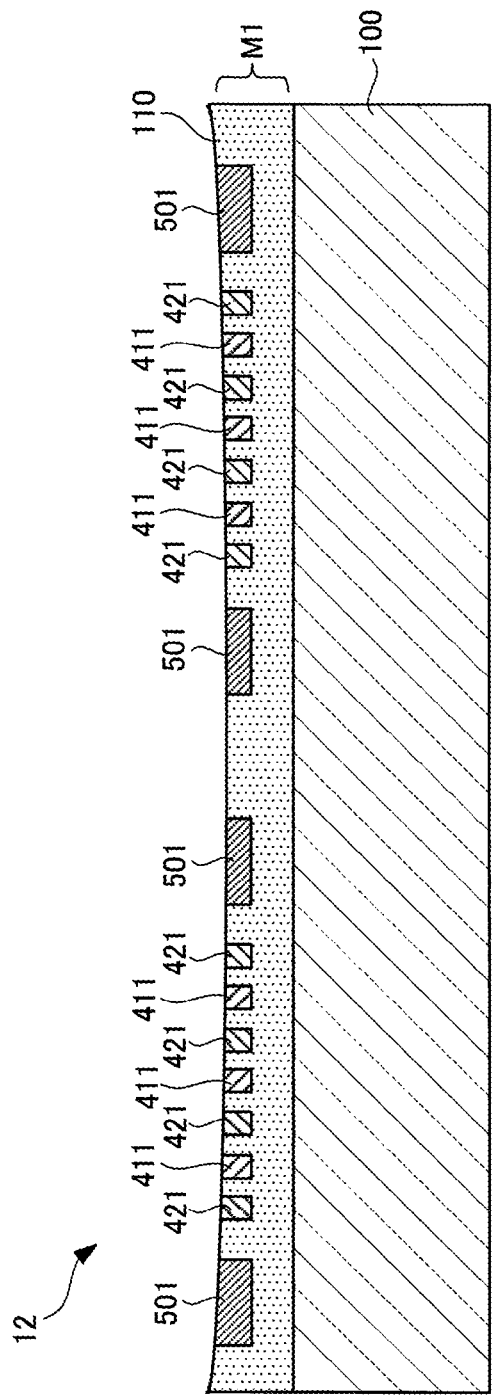
FIG. 17 is a cross-section of a capacitor array at the stage when formation of a metal wiring layer M1 has been completed, according to an exemplary embodiment of technology disclosed herein.

The capacitor array 12 according to the present exemplary embodiment may, as described above, be manufactured by damascene processes. FIG. 17 is a cross-section of the capacitor array 12 at the stage when formation of the metal wiring layer M1 has been completed, and is a cross-section taken along line 17-17 in FIG. 13.

In the damascene processes, extraneous wiring material is removed, and flattening of the surface of the metal wiring layer is performed, by utilizing a CMP method. Insulation film and metal constituting the wiring material are intermingled on the surface of the metal wiring layers being flattened. Thus in a CMP process, if the wiring line density (the metal density) on the polishing face is non-uniform, then the abrasion rate becomes non-uniform, with issues of deterioration of flatness of the polishing face. In the AD converter 10, the wiring line density (metal density) of the capacitor array 12-forming-region on the semiconductor substrate 100 tends to be higher than that of other regions (such as the comparator 14- or successive approximation control circuit 18-forming-regions). The abrasion rate of the central portion of the capacitor array 12 is accordingly higher than the abrasion rate of the outside portions thereof, and as illustrated in FIG. 17, indented dishing of the central portion of the capacitor array 12 with respect to outside portion sometimes occurs. Occurrence of such dishing makes the capacitance values of unit capacitors 30 placed in the central portion of the capacitor array 12 smaller than the capacitance values of the unit capacitors 30 placed at the outside portion thereof. As a result, the relative precision of capacitance values of the plural unit capacitors 30 included in the capacitor array 12 deteriorates, resulting in deterioration of the AD conversion precision.

Making the wiring line density (metal density) small in the capacitor array 12-forming-region effectively suppresses dishing. The capacitor array 12 according to the present exemplary embodiment has individual unit capacitors 30 that are in separated states from each other, enabling the separation between the unit capacitors 30 to be set at a chosen length. This thereby enables the wiring line density (metal density) to be made small in the capacitor array 12-forming-region such that variation in the capacitance values caused by dishing falls within a permissible range.

Moreover, an example of a countermeasure to prevent deterioration in the A/D conversion precision caused by processing characteristics, such as dishing, is to appropriately set the allocation of the capacitors Cd, C0 to C3 of the unit capacitors 30 (see FIG. 1). Namely, combinations of the unit capacitors 30 to the capacitors Cd, C0 to C3 are preferably determined so as to avoid clustering of the unit capacitors 30 that exhibit a relatively large capacitance value deviation due to the processing characteristics. In the capacitor array 12 according to the present exemplary embodiment, each of the unit capacitors 30 is surrounded by the shield section 50 so that electrostatic coupling does not occur with the other unit capacitors 30. It is thus possible to freely allocate the unit capacitors 30 to the capacitors Cd, C0 to C3 in consideration of the manufacturing process characteristics, since the placement of the unit capacitors 30 does not change the effect of parasitic capacitance. The degrees of freedom of design are high such that, for example, the placement of the unit capacitors 30 may be made such that there is a common centroid, and other states are possible.

Figure 18A:
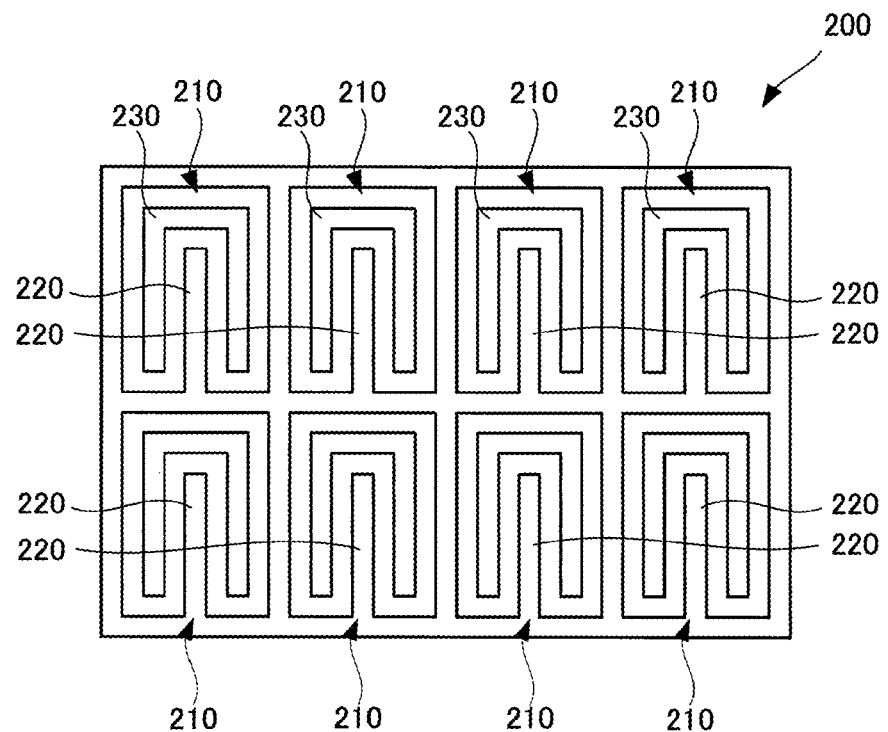
FIG. 18A is plan view of a capacitor array according to a comparative example.
Figure 18B:
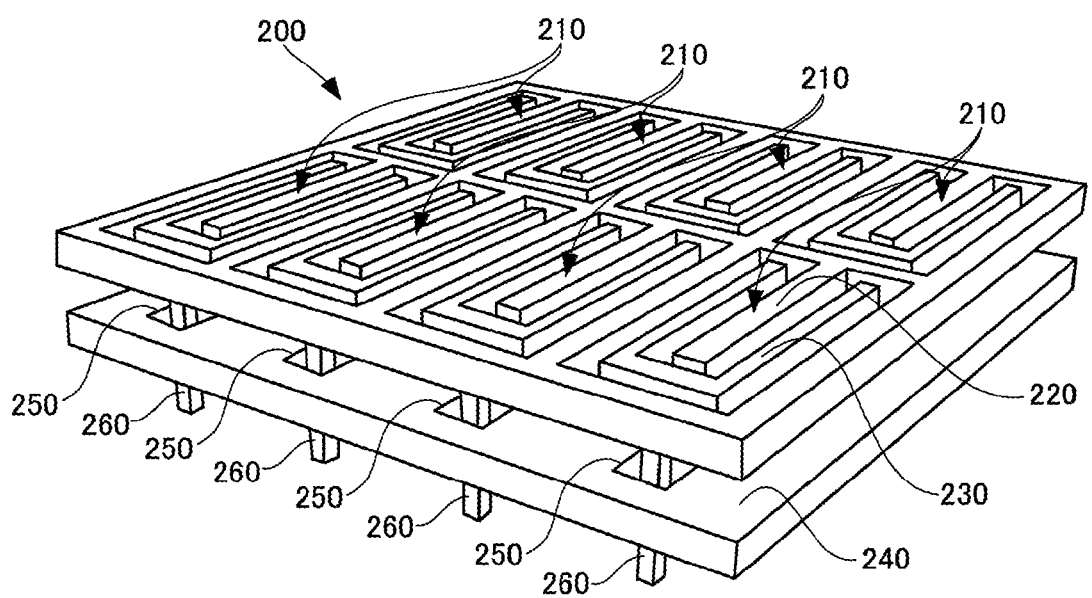
FIG. 18B is perspective view of a capacitor array according to a comparative example.

FIG. 18A is a plan view of a capacitor array 200 according to a Comparative Example, and FIG. 18B is a perspective view of the capacitor array 200 according to the Comparative Example. FIG. 18A and FIG. 18B illustrate 8 unit capacitors 210 that form the capacitor array 200. Each of the unit capacitors 210 includes a first electrode 220 and a second electrode 230. The first electrode 220 of each of the unit capacitors 210 forms a ring shape surrounding the second electrode 230, and is connected to the first electrode 220 of the other adjacent unit capacitors 210. Namely, the first electrodes 220 are common to mutually adjacent unit capacitors 210, and adjustment of the separation between the unit capacitors 210 is not possible in the capacitor array 200 according to the Comparative Example, resulting in lower degrees of freedom for design of the wiring line density than in the capacitor array 12 according to the present exemplary embodiment.

Moreover, as illustrated in FIG. 18B, the capacitor array 200 according to the Comparative Example includes a shield portion 240 fixed at a specific electrical potential (for example ground electrical potential) in a layer below the layer in which the first electrode 220 and the second electrode 230 are formed. The shield portion 240 has a flat plate shape extending across the entire capacitor array 200-forming-region. Plural through holes 250 are provided in the shield portion 240, and wiring lines 260 connected to the respective second electrodes 230 of each of the unit capacitors 210 pass through the through holes 250 and lead out below the shield portion 240. The shield portion 240 includes a function of preventing electrostatic coupling being formed between the wiring lines 260 and the first electrodes 220.

However, it is difficult to form the capacitor array 200 according to the Comparative Example by employing damascene processes. In damascene processes, processing conditions are optimized to match the minimum width wiring lines. If damascene processes are applied to cases in which there is a mixture of structures significantly wider in width than the minimum width wiring lines, and the minimum width wiring lines, then a uniform abrasion rate is not obtained, and there is a deterioration in flatness. In the capacitor array 200 according to the Comparative Example, the shield portion 240 has a flat plate shape extending across the entire capacitor array 200-forming-region, and is significantly wider in width than the minimum width wiring lines. It is accordingly difficult to form the capacitor array 200 according to the Comparative Example by employing damascene processes.

In contrast thereto, in the capacitor array 12 according to the present exemplary embodiment, the shield pieces 501 to 504 forming the shield section 50 are formed extending across the gaps 130 between the plural unit capacitors 30 with a width that is of an order of several times that of the minimum width wiring line. It is accordingly possible to appropriately employ damascene processes to manufacture the capacitor array 12. Damascene processes are recently mostly employed in processes for several-tens of nanometer line widths. The capacitor array 12 according to the present exemplary embodiment may thus be said to have a configuration appropriate to recent processes for several-tens of nanometer line widths.

Second Exemplary Embodiment

Figure 19:
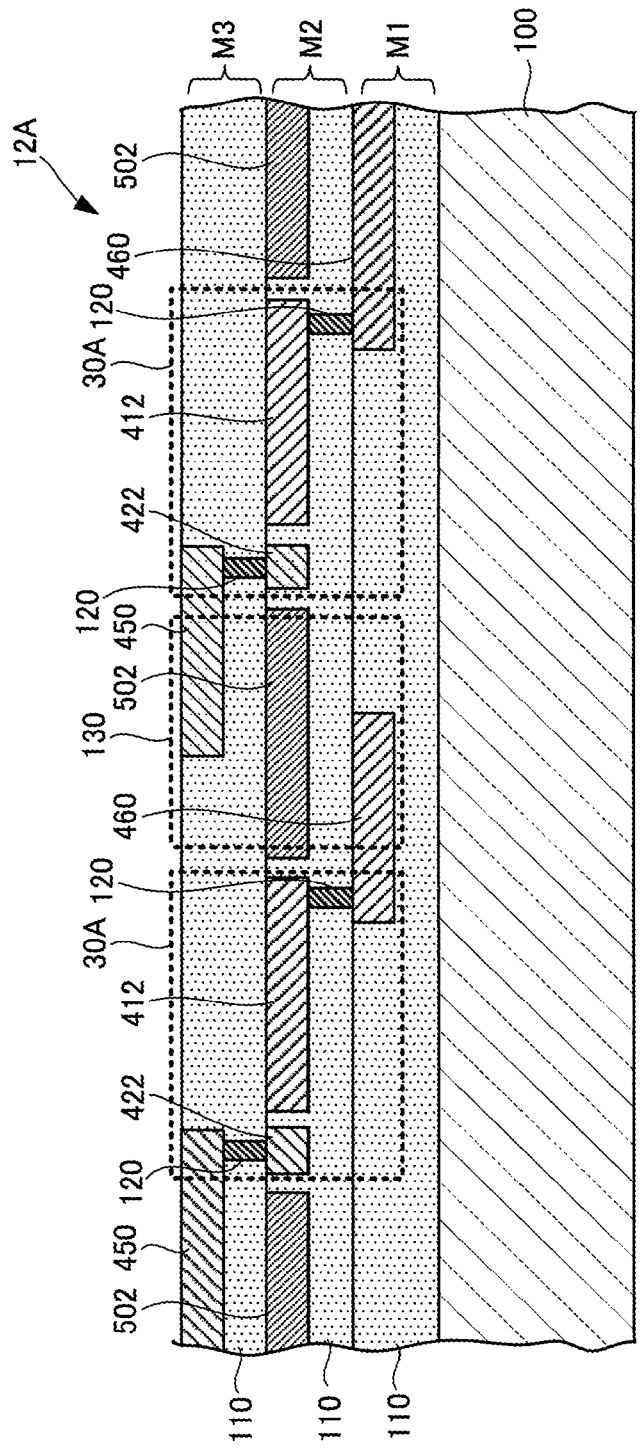
FIG. 19 is a cross-section illustrating a partial configuration of a capacitor array according to an exemplary embodiment of technology disclosed herein.
Figure 20:
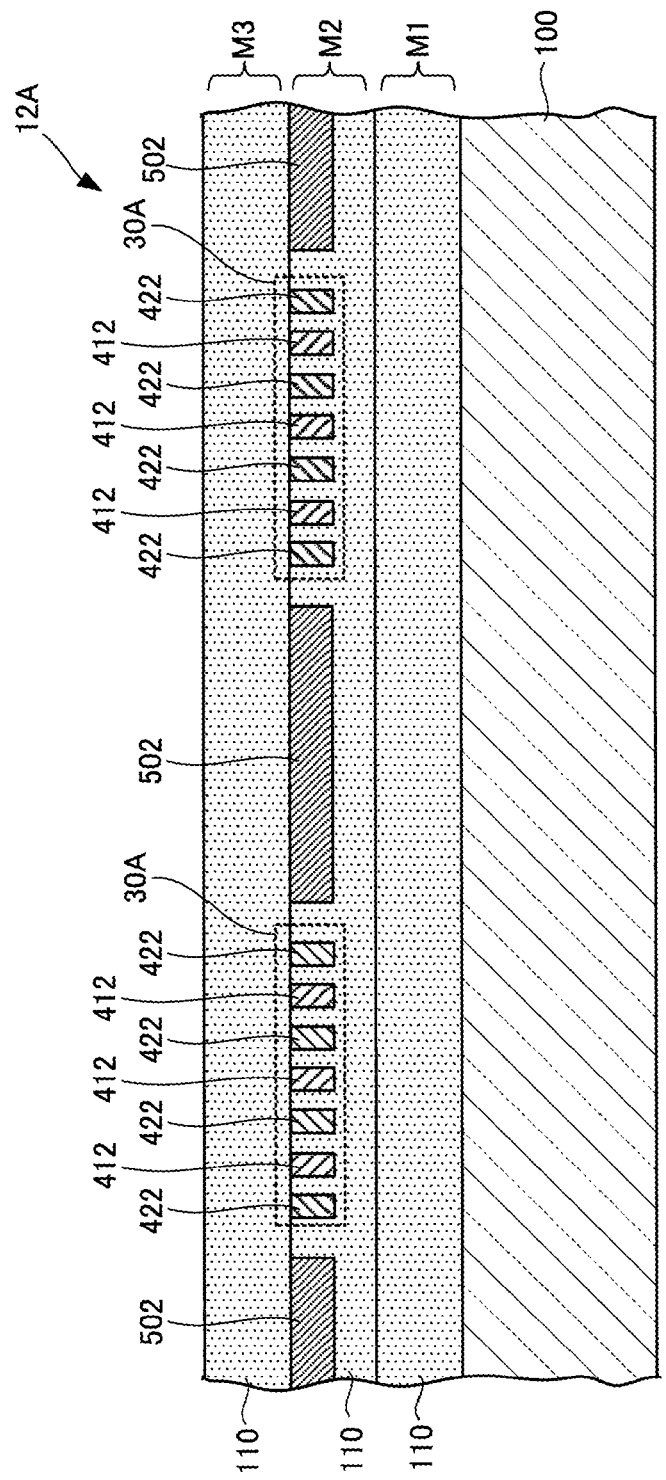
FIG. 20 is a cross-section illustrating a partial configuration of a capacitor array according to an exemplary embodiment of technology disclosed herein.

FIG. 19 and FIG. 20 are partial cross-sections illustrating configuration of a capacitor array 12A according to a second exemplary embodiment of technology disclosed herein. FIG. 19 is a cross-section corresponding to FIG. 4, and FIG. 20 is a cross-section corresponding to FIG. 5.

Each of unit capacitors 30A configuring the capacitor array 12A according to the second exemplary embodiment have a single layer structure in which first electrodes 41 and second electrodes 42 are formed in a single metal wiring layer. In the present exemplary embodiment, a metal wiring layer M2 is provided with an electrode piece 412 forming each of the first electrodes 41, and an electrode piece 412 forming each of the second electrodes 42. The layout of the metal wiring layer M2 is similar to that of the capacitor array 12 according to the first exemplary embodiment illustrated in FIG. 12. Namely, in the metal wiring layer M2, the electrode pieces 412 and 422 forming the unit capacitors 30A are formed in comb shapes, and a shield piece 502 is formed so as to extend across the gaps 130 between the plural unit capacitors 30A.

Bottom node wiring lines 450 are formed in a metal wiring layer M3. The bottom node wiring lines 450 are connected to the electrode pieces 422 formed in the metal wiring layer M2 through vias 120. The bottom node wiring lines 450 are disposed in the metal wiring layer M3 so as to pass through sites corresponding to the gaps 130 between the unit capacitors 30A.

The top node wiring lines 460 are formed in a metal wiring layer M1. The top node wiring lines 460 are connected to the electrode piece 412 formed in the metal wiring layer M2 through the vias 120. The top node wiring lines 460 are disposed in the metal wiring layer M1 so as to pass through sites corresponding to the gaps 130 between the unit capacitors 30A.

Thus, similarly to with the capacitor array 12 of the first exemplary embodiment, in the capacitor array 12A according to the second exemplary embodiment, the bottom node wiring lines 450 and the top node wiring lines 460 are separated at an interval equivalent to one layer of metal wiring layer in the stacking direction of the metal wiring layers M1 to M3. The bottom node wiring lines 450 and the top node wiring lines 460 are also both disposed so as to pass through sites corresponding to the gaps 130 between the plural unit capacitors 30A. However, a shield piece 502 extends in a metal wiring layer M2, between the metal wiring layer M3 in which the bottom node wiring lines 450 are provided, and the metal wiring layer M1 in which the top node wiring lines 460 are provided, extending across the gaps 130 between the plural unit capacitors 30A. Namely, the shield piece 502 is provided interposed, in the stacking direction of the metal wiring layers M1 to M3, between the bottom node wiring lines 450 and the top node wiring lines 460.

The above configuration enables electrostatic coupling to be prevented from forming between the bottom node wiring lines 450 and the top node wiring lines 460. Thus similar advantageous effects can be obtained to those of the capacitor array 12 according to the first exemplary embodiment, even in cases in which each of the unit capacitors 30A has a single layer structure. Note that although a case is illustrated in the second exemplary embodiment in which the first electrodes 41 and the second electrodes 42 of the unit capacitors 30A are formed in the metal wiring layer M2, the first electrode 41 and the second electrodes 42 may be formed in the metal wiring layer M1 or the metal wiring layer M3. For example, in cases in which the first electrode 41 and the second electrode 42 are formed in the metal wiring layer M1, the top node wiring lines 460 may be formed in the metal wiring layer M1, the bottom node wiring lines 450 may be formed in the metal wiring layer M3, and the shield piece 502 may be formed in the metal wiring layer M2. In such cases, the shield piece 502 extends across sites corresponding to the gaps 130 between the plural unit capacitors 30A.

Figure 21A:
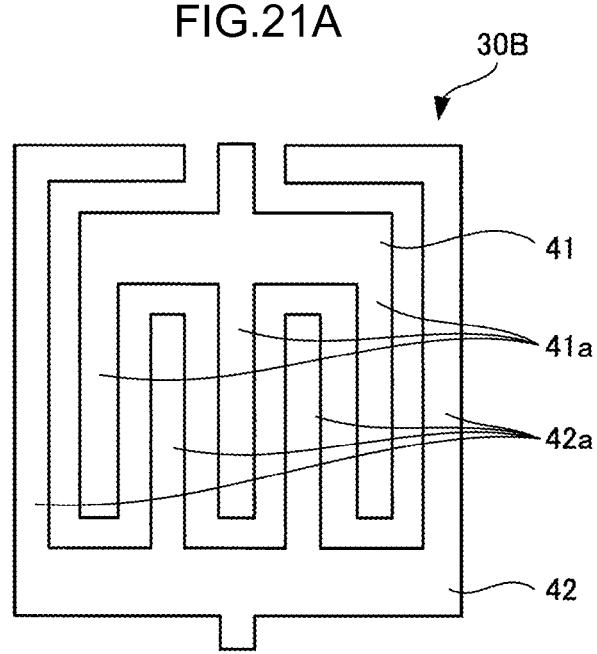
FIG. 21A is a diagram illustrating a modified example of an electrode shape in a unit capacitor according to an exemplary embodiment of technology disclosed herein.
Figure 21B:
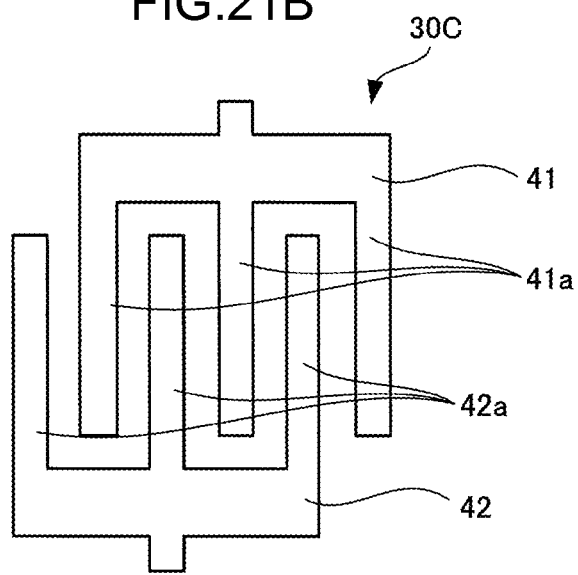
FIG. 21B is a diagram illustrating a modified example of an electrode shape in a unit capacitor according to an exemplary embodiment of technology disclosed herein.

Technology disclosed herein is not limited to each of the exemplary embodiments described above, and various modifications are possible. FIG. 21A and FIG. 21B illustrate respective modified examples of the electrode shape in unit capacitors.

The unit capacitor 30B illustrated in FIG. 21A includes a comb shaped first electrode 41 and a comb shaped second electrode 42. The first electrode 41 includes three comb tooth portions 41a, and the second electrode 42 includes four comb toothed portions 42a. The comb toothed portions 42a and the comb tooth portions 41a are disposed alternately in a row in the same wiring layer, or in plan view of the semiconductor substrate 100. Each of the comb toothed portions 42a disposed at the outside of the comb tooth portions 41a has a pattern that passes the side of the adjacent comb tooth portion 41a and around to the rear of the comb tooth portion 41a. Namely, the unit capacitor 30B has a configuration in which the second electrode 42 surrounds the first electrode 41 on four sides. Such a configuration in which the outer periphery of the first electrodes 41 is surrounded by the second electrode 42 on four sides enables the capacitance values of parasitic capacitors occurring between the first electrode 41 and the shield section 50 to be made smaller than those of the unit capacitors 30 according to the first exemplary embodiment having configurations that surround on three sides. The unit capacitor 30B may be formed with a single layer structure or with a stacked layer structure.

The unit capacitor 30C illustrated in FIG. 21B includes a comb shaped first electrode 41 and second electrode 42. The first electrode 41 includes three comb tooth portions 41a, and the second electrode 42 includes three comb toothed portions 42a. The comb toothed portions 42a and the comb tooth portions 41a are disposed alternately in a row in the same wiring layer, or in plan view of the semiconductor substrate 100. Thus the number of the comb tooth portions 41a and the number of the comb toothed portions 42a are equal, and the surface area of the unit capacitor 30C can be made smaller than the surface area of the unit capacitors 30 and 30B by configuring such that one electrode does not surround the outer periphery of the other electrode on three sides or on four sides. Note that the unit capacitor 30C may be formed with a single layer structure or with a stacked layer structure.

In each of the exemplary embodiments described above, examples are illustrated in which the unit capacitors include comb shaped electrodes; however, the electrode shape of unit capacitors is not limited to being comb shaped. The unit capacitors may have any configuration in which plural electrode forming elements are disposed side-by-side within the same wiring layer, or in a plan view of the semiconductor substrate 100.

In each of the exemplary embodiments described above, examples have been illustrated of cases in which the bottom node wiring lines 450 and the top node wiring lines 460 are separated from each other at an interval equivalent to one layer of metal wiring layer in the stacking direction of the metal wiring layers; however there is no limitation thereto. The bottom node wiring lines 450 and the top node wiring lines 460 may be separated from each other at an interval equivalent to two or more layers of metal wiring layer in the stacking direction of the metal wiring layers.

In the above exemplary embodiments, explanation has been given of cases in which ring shaped shield pieces 501, 503, and 504 are provided at the outer periphery of the unit capacitors 30. However, the shield pieces 501, 503, and 504 may be omitted in cases in which the effects of parasitic capacitors formed within the same wiring layer is not a problem.

In the exemplary embodiments described above, the shield piece 502 is provided so as to extend across the entire region of the gaps 130 between the plural unit capacitors 30; however, there is no limitation to such a configuration. The shield piece 502 may be selectively provided only at portions of the gaps between the plural unit capacitors 30 where the bottom node wiring lines 450 and the top node wiring lines 460 overlap, or portions in the vicinity thereof.

In the exemplary embodiments described above, examples have been illustrated in which capacitor arrays include plural unit capacitors each having the same capacitance value; however, the capacitor array may include plural types of capacitor with mutually different capacitance values.

An aspect of technology disclosed herein exhibits the advantageous effect of preventing deterioration, caused by parasitic capacitors, in the relative precision of capacitance values of capacitor groups contained in a capacitor array.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A capacitor array, comprising:
a plurality of capacitors provided at intervals from each other and each including a first electrode and a second electrode that are provided in at least one layer of a plurality of layers and face each other;
a first wiring line connected to the first electrodes of the plurality of capacitors, provided in any layer of the plurality of layers, and provided so as to pass through gaps between the plurality of capacitors or to pass through sites corresponding to the gaps between the plurality of capacitors;
a second wiring line connected to the second electrodes of the plurality of capacitors, provided in a layer separated by at least one layer from the layer in which the first wiring line is provided, and provided so as to pass through the gaps between the plurality of capacitors or to pass through sites corresponding to the gaps between the plurality of capacitors; and
a first conductor provided in a layer between the layer in which the first wiring line is provided and the layer in which the second wiring line is provided, so as to be interposed between the first wiring line and the second wiring line, and extending across the gaps between the plurality of capacitors, or across sites corresponding to the gaps between the plurality of capacitors, the first conductor being insulated from the plurality of capacitors.

2. The capacitor array of claim 1, further comprising:
a plurality of second conductors that are provided in the layer in which the first wiring line is provided, so as to surround respective outer peripheries of the plurality of capacitors, and that are electrically connected to the first conductor and insulated from the plurality of capacitors; and a plurality of third conductors that are provided in the layer in which the second wiring line is provided, so as to surround the respective outer peripheries of the plurality of capacitors, and that are electrically connected to the first conductor and insulated from the plurality of capacitors, wherein
each of the first electrodes includes a plurality of first electrode pieces that are provided in respective layers of three or more layers, and that are electrically connected to each other;
each of the second electrodes includes a plurality of second electrode pieces that are provided in the respective layers in which the plurality of first electrode pieces are provided, and that are electrically connected to each other; and
the first wiring line and the second wiring line are respectively provided in one of the respective layers in which the plurality of first electrode pieces and the plurality of second electrode pieces are provided;
each of the plurality of capacitors is disposed at an inner side of a corresponding second conductor of the plurality of second conductors, and at an inner side of a corresponding third conductor of the plurality of third conductors;
a portion of the first wiring line passing through the gaps between the plurality of capacitors is disposed at an outer side of each of the second conductors; and
a portion of the second wiring line passing through the gaps between the plurality of capacitors is disposed at an outer side of each of the third conductors.

3. The capacitor array of claim 2, wherein each of the second conductors and each of the third conductors includes an opening, and the first wiring line leads out from a connection point with the first electrode to the outer side of the second conductor by passing through the opening of the second conductor, and the second wiring line leads out from a connection point with the second electrode to the outer side of the third conductor by passing through the opening of the third conductor.

4. The capacitor array of claim 2, further comprising:
a plurality of fourth conductors that are provided in a layer above the layers in which the plurality of first electrode pieces and the plurality of second electrode pieces are provided, so as to surround outer peripheries of regions corresponding to the plurality of capacitors, and that are electrically connected to the first conductor.

5. The capacitor array of claim 2, wherein:
the first conductor, the second conductors, and the third conductors are electrically connected to each other by a plurality of connecting conductors; and
the plurality of connecting conductors are provided so as to form a plurality of rows along outer edges of the second conductors and the third conductors, with the connecting conductors arrayed in a first row being disposed at positions between the connecting conductors arrayed in a second row different from the first row.

6. The capacitor array of claim 2, wherein each of the plurality of second electrode pieces is formed so as to surround an outer periphery of a corresponding first electrode piece on at least three sides.

7. The capacitor array of claim 1, wherein the first conductor includes:
a plurality of first conductor regions that are provided in a layer between the layer in which the first wiring line is provided and the layer in which the second wiring line is provided, so as to surround outer peripheries of the plurality of capacitors, and that are insulated from the plurality of capacitors; and
a second conductor region that extends across an entire region of gaps between the plurality of first conductor regions.

8. The capacitor array of claim 1, wherein:
the first conductor is a single conductor that is disposed in the layer between the layer in which the first wiring line is provided and the layer in which the second wiring line is provided, that includes a plurality of openings provided at sites corresponding to the plurality of capacitors, and that is insulated from the plurality of capacitors; and
each of the plurality of capacitors is disposed at an inner side of a corresponding opening of the plurality of openings.

9. The capacitor array of claim 1, wherein the first electrodes and the second electrodes each have a comb shape.

10. The capacitor array of claim 1, wherein the first electrodes and the second electrodes are each provided in one layer of the plurality of layers, and the first conductor is provided in layers in which the first electrodes and the second electrodes are provided.

11. The capacitor array of claim 1, wherein the plurality of capacitors form a plurality of composite capacitors having binary-weighted capacitance values.

12. The capacitor array of claim 1, wherein the capacitor array is formed on or above a semiconductor substrate.

13. An AD converter, comprising:
a capacitor DA converter including a capacitor array; and
a control circuit that controls operation of the capacitor DA converter, wherein the capacitor array includes:
a plurality of capacitors provided at intervals from each other and each including a first electrode and a second electrode that are provided in at least one layer of a plurality of layers and face each other;
a first wiring line connected to the first electrodes of the plurality of capacitors, provided in any layer of the plurality of layers, and provided so as to pass through gaps between the plurality of capacitors or to pass through sites corresponding to the gaps between the plurality of capacitors;
a second wiring line connected to the second electrodes of the plurality of capacitors, provided in a layer separated by at least one layer from the layer in which the first wiring line is provided, and provided so as to pass through the gaps between the plurality of capacitors or to pass through sites corresponding to the gaps between the plurality of capacitors; and
a first conductor provided in a layer between the layer in which the first wiring line is provided and the layer in which the second wiring line is provided, so as to be interposed between the first wiring line and the second wiring line, and extending across the gaps between the plurality of capacitors, or across sites corresponding to the gaps between the plurality of capacitors, the first conductor being insulated from the plurality of capacitors.

14. The AD converter of claim 13, wherein:
the AD converter is a successive approximation-type AD converter including a comparator that compares a reference voltage generated by the capacitor DA converter against an input voltage; and
the control circuit controls operation of the capacitor DA converter based on a comparison result of the comparator.

15. The AD converter of claim 13, wherein
the capacitor array further includes:
a plurality of second conductors that are provided in the layer in which the first wiring line is provided, so as to surround respective outer peripheries of the plurality of capacitors, and that are electrically connected to the first conductor and insulated from the plurality of capacitors; and
a plurality of third conductors that are provided in the layer in which the second wiring line is provided, so as to surround the respective outer peripheries of the plurality of capacitors, and that are electrically connected to the first conductor and insulated from the plurality of capacitors, wherein
each of the first electrodes includes a plurality of first electrode pieces that are provided in respective layers of three or more layers, and that are electrically connected to each other;
each of the second electrodes includes a plurality of second electrode pieces that are provided in the respective layers in which the plurality of first electrode pieces are provided, and that are electrically connected to each other; and
the first wiring line and the second wiring line are respectively provided in one of the respective layers in which the plurality of first electrode pieces and the plurality of second electrode pieces are provided;
each of the plurality of capacitors is disposed at an inner side of a corresponding second conductor of the plurality of second conductors, and at an inner side of a corresponding third conductor of the plurality of third conductors;
a portion of the first wiring line passing through the gaps between the plurality of capacitors is disposed at an outer side of each of the second conductors; and
a portion of the second wiring line passing through the gaps between the plurality of capacitors is disposed at an outer side of each of the third conductors.

16. The AD converter of claim 15, wherein each of the second conductors and each of the third conductors includes an opening, and the first wiring line leads out from a connection point with the first electrode to the outer side of the second conductor by passing through the opening of the second conductor, and the second wiring line leads out from a connection point with the second electrode to the outer side of the third conductor by passing through the opening of the third conductor.

17. The AD converter of claim 13, wherein:
the first conductor is a single conductor that is disposed in the layer between the layer in which the first wiring line is provided and the layer in which the second wiring line is provided, that includes a plurality of openings provided at sites corresponding to the plurality of capacitors, and that is insulated from the plurality of capacitors; and
each of the plurality of capacitors is disposed at an inner side of a corresponding opening of the plurality of openings.

18. A semiconductor device, comprising:
a plurality of capacitors provided at intervals from each other and each including a first electrode and a second electrode that are provided in at least one layer of a plurality of layers and face each other;
a first wiring line connected to the first electrodes of the plurality of capacitors, provided in any layer of the plurality of layers, and provided so as to pass through gaps between the plurality of capacitors or to pass through sites corresponding to the gaps between the plurality of capacitors;

a second wiring line connected to the second electrodes of the plurality of capacitors, provided in a layer separated by at least one layer from the layer in which the first wiring line is provided, and provided so as to pass through the gaps between the plurality of capacitors or to pass through sites corresponding to the gaps between the plurality of capacitors; and a first conductor provided in a layer between the layer in which the first wiring line is provided and the layer in which the second wiring line is provided, so as to be interposed between the first wiring line and the second wiring line, and extending across the gaps between the plurality of capacitors, or across sites corresponding to the gaps between the plurality of capacitors, the first conductor being insulated from the plurality of capacitors.

19. The semiconductor device of claim 18, further comprising:

a plurality of second conductors that are provided in the layer in which the first wiring line is provided, so as to surround respective outer peripheries of the plurality of capacitors, and that are electrically connected to the first conductor and insulated from the plurality of capacitors; and a plurality of third conductors that are provided in the layer in which the second wiring line is provided, so as to surround the respective outer peripheries of the plurality of capacitors, and that are electrically connected to the first conductor and insulated from the plurality of capacitors, wherein each of the first electrodes includes a plurality of first electrode pieces that are provided in respective layers of three or more layers, and that are electrically connected to each other;

each of the second electrodes includes a plurality of second electrode pieces that are provided in the respective layers in which the plurality of first electrode pieces are provided, and that are electrically connected to each other; and the first wiring line and the second wiring line are respectively provided in one of the respective layers in which the plurality of first electrode pieces and the plurality of second electrode pieces are provided;

each of the plurality of capacitors is disposed at an inner side of a corresponding second conductor of the plurality of second conductors, and at an inner side of a corresponding third conductor of the plurality of third conductors;

a portion of the first wiring line passing through the gaps between the plurality of capacitors is disposed at an outer side of each of the second conductors; and a portion of the second wiring line passing through the gaps between the plurality of capacitors is disposed at an outer side of each of the third conductors.

20. The semiconductor device of claim 18, wherein:

the first conductor is a single conductor that is disposed in the layer between the layer in which the first wiring line is provided and the layer in which the second wiring line is provided, that includes a plurality of openings provided at sites corresponding to the plurality of capacitors, and that is insulated from the plurality of capacitors; and each of the plurality of capacitors is disposed at an inner side of a corresponding opening of the plurality of openings.

* * * * *